United States Patent
Lutz et al.

(10) Patent No.: US 9,098,117 B2
(45) Date of Patent: Aug. 4, 2015

(54) CLASSIFYING THE INTENT OF USER INPUT

(71) Applicant: Microsoft Corporation, Redmond, WA (US)

(72) Inventors: Moshe R. Lutz, Bellevue, WA (US); Paul Henry Dietz, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 13/651,232

(22) Filed: Oct. 12, 2012

(65) Prior Publication Data

US 2013/0229347 A1  Sep. 5, 2013

Related U.S. Application Data

(63) Continuation of application No. 13/471,336, filed on May 14, 2012.

(60) Provisional application No. 61/606,321, filed on Mar. 2, 2012, provisional application No. 61/606,301, filed (Continued)

(51) Int. Cl.
*G06F 3/041* (2006.01)
*G06F 3/02* (2006.01)
(Continued)

(52) U.S. Cl.
CPC .............. *G06F 3/0202* (2013.01); *G05B 11/01* (2013.01); *G06F 1/1618* (2013.01); *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1684* (2013.01); *G06F 3/002* (2013.01); *G06F 3/01* (2013.01); *G06F 3/023* (2013.01); *G06F 3/0414* (2013.01);
(Continued)

(58) Field of Classification Search
CPC .............................. G06F 1/1618; G06F 3/016
USPC ..................................... 345/173–178; 702/41
See application file for complete search history.

(56) References Cited

U.S. PATENT DOCUMENTS

| 578,325 A | 3/1897 | Fleming, Andrew |
| 3,600,528 A | 8/1971 | Leposavic |

(Continued)

FOREIGN PATENT DOCUMENTS

| CA | 990023 | 6/1976 |
| CN | 101675406 | 3/2010 |

(Continued)

OTHER PUBLICATIONS

FingerWorks (NPL dated 2002, attached as pdf file named fingerworks_touchstream.pdf).*

(Continued)

*Primary Examiner* — Charles V Hicks
*Assistant Examiner* — Charles Zheng
(74) *Attorney, Agent, or Firm* — Brandon Roper; Judy Yee; Micky Minhas

(57) ABSTRACT

Different types of user inputs can be input by a user via a keyboard of an input device. These different types of user inputs include, for example, key strikes, multi-touch interactions, single finger motions, and/or mouse clicks. Touch information regarding the pressure applied to the keys of a pressure sensitive keyboard over time (or the contact area of the user input for other types of keyboards over time) is used to classify the intent of the user input as one of the various types of user inputs.

20 Claims, 10 Drawing Sheets

Related U.S. Application Data on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.

| | | |
|---|---|---|
| *H01H 13/79* | (2006.01) | |
| *H01H 13/78* | (2006.01) | |
| *H01H 13/785* | (2006.01) | |
| *G06F 1/16* | (2006.01) | |
| *H05K 5/02* | (2006.01) | |
| *H04M 1/02* | (2006.01) | |
| *H04M 1/725* | (2006.01) | |
| *G05B 11/01* | (2006.01) | |
| *H01H 13/704* | (2006.01) | |
| *H01H 13/82* | (2006.01) | |
| *G06F 3/00* | (2006.01) | |
| *G06F 3/01* | (2006.01) | |
| *H01H 13/702* | (2006.01) | |
| *H01H 13/14* | (2006.01) | |
| *H01H 13/703* | (2006.01) | |
| *G06F 9/54* | (2006.01) | |
| *G06F 11/30* | (2006.01) | |
| *G06F 13/10* | (2006.01) | |
| *G06F 3/023* | (2006.01) | |

(52) U.S. Cl.
CPC ............. *G06F3/0416* (2013.01); *G06F 9/541* (2013.01); *G06F 11/3089* (2013.01); *G06F 13/102* (2013.01); *H01H 13/14* (2013.01); *H01H 13/702* (2013.01); *H01H 13/703* (2013.01); *H01H 13/704* (2013.01); *H01H 13/78* (2013.01); *H01H 13/785* (2013.01); *H01H 13/79* (2013.01); *H01H 13/82* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 2201/036* (2013.01); *H01H 2205/006* (2013.01); *H01H 2211/006* (2013.01); *H01H 2217/004* (2013.01); *H04M 1/0245* (2013.01); *Y10T 16/5401* (2015.01); *Y10T 16/551* (2015.01); *Y10T 29/49826* (2015.01)

(56) References Cited

U.S. PATENT DOCUMENTS

| | | | |
|---|---|---|---|
| 3,777,082 A | 12/1973 | Hatley | |
| 3,879,586 A | 4/1975 | DuRocher et al. | |
| 4,046,975 A | 9/1977 | Seeger, Jr. | |
| 4,065,649 A | 12/1977 | Carter et al. | |
| 4,086,451 A | 4/1978 | Boulanger | |
| 4,243,861 A | 1/1981 | Strandwitz | |
| 4,261,042 A | 4/1981 | Ishiwatari et al. | |
| 4,302,648 A | 11/1981 | Sado et al. | |
| 4,317,013 A | 2/1982 | Larson | |
| 4,365,130 A | 12/1982 | Christensen | |
| 4,492,829 A | 1/1985 | Rodrique | |
| 4,503,294 A | 3/1985 | Matsumaru | |
| 4,527,021 A | 7/1985 | Morikawa et al. | |
| 4,559,426 A | 12/1985 | Van Zeeland et al. | |
| 4,577,822 A | 3/1986 | Wilkerson | |
| 4,588,187 A | 5/1986 | Dell | |
| 4,607,147 A | 8/1986 | Ono et al. | |
| 4,651,133 A | 3/1987 | Ganesan et al. | |
| 4,735,394 A | 4/1988 | Facco | |
| 4,864,084 A | 9/1989 | Cardinale | |
| 4,996,511 A | 2/1991 | Ohkawa et al. | |
| 5,008,497 A * | 4/1991 | Asher | 178/18.05 |
| 5,021,638 A | 6/1991 | Nopper et al. | |
| 5,107,401 A | 4/1992 | Youn | |
| 5,128,829 A | 7/1992 | Loew | |
| 5,220,521 A | 6/1993 | Kikinis | |
| 5,235,495 A | 8/1993 | Blair et al. | |
| 5,283,559 A | 2/1994 | Kalendra et al. | |
| 5,331,443 A | 7/1994 | Stanisci | |
| 5,363,075 A | 11/1994 | Fanucchi | |
| 5,375,076 A | 12/1994 | Goodrich et al. | |
| 5,404,133 A | 4/1995 | Moriike et al. | |
| 5,480,118 A | 1/1996 | Cross | |
| 5,491,313 A | 2/1996 | Bartley et al. | |
| 5,546,271 A | 8/1996 | Gut et al. | |
| 5,548,477 A | 8/1996 | Kumar et al. | |
| 5,558,577 A | 9/1996 | Kato | |
| 5,618,232 A | 4/1997 | Martin | |
| 5,661,279 A | 8/1997 | Kenmochi | |
| 5,666,112 A | 9/1997 | Crowley et al. | |
| 5,681,220 A | 10/1997 | Bertram et al. | |
| 5,737,183 A | 4/1998 | Kobayashi et al. | |
| 5,745,376 A | 4/1998 | Barker et al. | |
| 5,748,114 A | 5/1998 | Koehn | |
| 5,781,406 A | 7/1998 | Hunte | |
| 5,807,175 A | 9/1998 | Davis et al. | |
| 5,818,361 A | 10/1998 | Acevedo | |
| 5,828,770 A | 10/1998 | Leis et al. | |
| 5,842,027 A | 11/1998 | Oprescu et al. | |
| 5,874,697 A | 2/1999 | Selker et al. | |
| 5,905,485 A | 5/1999 | Podoloff | |
| 5,924,555 A | 7/1999 | Sadamori et al. | |
| 5,926,170 A | 7/1999 | Oba | |
| 5,948,990 A | 9/1999 | Hashida | |
| 5,971,635 A | 10/1999 | Wise | |
| 6,002,389 A * | 12/1999 | Kasser | 345/173 |
| 6,002,581 A | 12/1999 | Lindsey | |
| 6,005,209 A | 12/1999 | Burleson et al. | |
| 6,012,714 A | 1/2000 | Worley et al. | |
| 6,040,823 A | 3/2000 | Seffernick et al. | |
| 6,042,075 A | 3/2000 | Burch, Jr. | |
| 6,044,717 A | 4/2000 | Biegelsen et al. | |
| 6,055,705 A | 5/2000 | Komatsu et al. | |
| 6,061,644 A | 5/2000 | Leis | |
| 6,108,200 A | 8/2000 | Fullerton | |
| 6,112,797 A | 9/2000 | Colson et al. | |
| 6,128,007 A | 10/2000 | Seybold | |
| 6,178,085 B1 | 1/2001 | Leung | |
| 6,178,443 B1 | 1/2001 | Lin | |
| 6,234,820 B1 | 5/2001 | Perino et al. | |
| 6,254,105 B1 | 7/2001 | Rinde et al. | |
| 6,279,060 B1 | 8/2001 | Luke et al. | |
| 6,329,617 B1 | 12/2001 | Burgess | |
| 6,344,791 B1 | 2/2002 | Armstrong | |
| 6,366,440 B1 | 4/2002 | Kung | |
| 6,380,497 B1 | 4/2002 | Hashimoto et al. | |
| 6,437,682 B1 | 8/2002 | Vance | |
| 6,506,983 B1 | 1/2003 | Babb et al. | |
| 6,511,378 B1 | 1/2003 | Bhatt et al. | |
| 6,532,147 B1 | 3/2003 | Christ, Jr. | |
| 6,543,949 B1 | 4/2003 | Ritchey et al. | |
| 6,555,024 B2 | 4/2003 | Ueda et al. | |
| 6,565,439 B2 | 5/2003 | Shinohara et al. | |
| 6,585,435 B2 | 7/2003 | Fang | |
| 6,597,347 B1 | 7/2003 | Yasutake | |
| 6,600,121 B1 | 7/2003 | Olodort et al. | |
| 6,603,408 B1 | 8/2003 | Gaba | |
| 6,608,664 B1 | 8/2003 | Hasegawa | |
| 6,617,536 B2 | 9/2003 | Kawaguchi | |
| 6,651,943 B2 | 11/2003 | Cho et al. | |
| 6,685,369 B2 | 2/2004 | Lien | |
| 6,687,614 B2 | 2/2004 | Ihara et al. | |
| 6,695,273 B2 | 2/2004 | Iguchi | |
| 6,704,864 B1 | 3/2004 | Philyaw | |
| 6,721,019 B2 | 4/2004 | Kono et al. | |
| 6,725,318 B1 * | 4/2004 | Sherman et al. | 710/313 |
| 6,774,888 B1 | 8/2004 | Genduso | |
| 6,776,546 B2 | 8/2004 | Kraus et al. | |

(56) References Cited

U.S. PATENT DOCUMENTS

| | | |
|---|---|---|
| 6,780,019 B1 | 8/2004 | Ghosh et al. |
| 6,781,819 B2 | 8/2004 | Yang et al. |
| 6,784,869 B1 | 8/2004 | Clark et al. |
| 6,798,887 B1 | 9/2004 | Andre |
| 6,813,143 B2 | 11/2004 | Makela |
| 6,819,316 B2 | 11/2004 | Schulz et al. |
| 6,856,506 B2 | 2/2005 | Doherty et al. |
| 6,861,961 B2 | 3/2005 | Sandbach et al. |
| 6,898,315 B2 | 5/2005 | Guha |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 7,007,238 B2 | 2/2006 | Glaser |
| 7,051,149 B2 | 5/2006 | Wang et al. |
| 7,068,496 B2 | 6/2006 | Wong et al. |
| 7,083,295 B1 | 8/2006 | Hanna |
| 7,091,436 B2 | 8/2006 | Serban |
| 7,095,404 B2 | 8/2006 | Vincent et al. |
| 7,099,149 B2 | 8/2006 | Krieger et al. |
| 7,106,222 B2 | 9/2006 | Ward et al. |
| 7,116,309 B1 | 10/2006 | Kimura et al. |
| 7,123,292 B1 | 10/2006 | Seeger et al. |
| 7,136,282 B1 | 11/2006 | Rebeske |
| D535,292 S | 1/2007 | Shi et al. |
| 7,194,662 B2 | 3/2007 | Do et al. |
| 7,213,991 B2 | 5/2007 | Chapman et al. |
| 7,252,512 B2 | 8/2007 | Tai et al. |
| 7,260,221 B1 | 8/2007 | Atsmon |
| 7,277,087 B2 | 10/2007 | Hill et al. |
| 7,280,348 B2 | 10/2007 | Ghosh |
| 7,301,759 B2 | 11/2007 | Hsiung |
| 7,348,513 B2 | 3/2008 | Lin |
| 7,365,967 B2 | 4/2008 | Zheng |
| 7,415,676 B2 | 8/2008 | Fujita |
| 7,447,934 B2 | 11/2008 | Dasari et al. |
| 7,457,108 B2 | 11/2008 | Ghosh |
| 7,469,386 B2 | 12/2008 | Bear et al. |
| 7,486,165 B2 | 2/2009 | Ligtenberg et al. |
| 7,499,037 B2 | 3/2009 | Lube |
| 7,502,803 B2 | 3/2009 | Culter et al. |
| 7,528,337 B2 | 5/2009 | Tanabe et al. |
| 7,539,882 B2 | 5/2009 | Jessup et al. |
| 7,542,052 B2 | 6/2009 | Solomon et al. |
| 7,558,594 B2 | 7/2009 | Wilson |
| 7,559,834 B1 | 7/2009 | York |
| RE40,891 E | 9/2009 | Yasutake |
| 7,594,638 B2 | 9/2009 | Chan et al. |
| 7,620,244 B1 | 11/2009 | Collier |
| 7,636,921 B2 | 12/2009 | Louie |
| 7,639,876 B2 | 12/2009 | Clary et al. |
| 7,656,392 B2 | 2/2010 | Bolender |
| 7,729,493 B2 | 6/2010 | Krieger et al. |
| 7,731,147 B2 | 6/2010 | Rha |
| 7,733,326 B1 | 6/2010 | Adiseshan |
| 7,773,076 B2 | 8/2010 | Pittel et al. |
| 7,777,972 B1 | 8/2010 | Chen et al. |
| 7,782,342 B2 | 8/2010 | Koh |
| 7,813,715 B2 | 10/2010 | McKillop et al. |
| 7,822,338 B2 | 10/2010 | Wernersson |
| 7,865,639 B2 | 1/2011 | McCoy et al. |
| 7,884,807 B2 | 2/2011 | Hovden et al. |
| 7,893,921 B2 | 2/2011 | Sato |
| D636,397 S | 4/2011 | Green |
| 7,928,964 B2 | 4/2011 | Kolmykov-Zotov et al. |
| 7,932,890 B2 | 4/2011 | Onikiri et al. |
| 7,944,520 B2 | 5/2011 | Ichioka et al. |
| 7,945,717 B2 | 5/2011 | Rivalsi |
| 7,973,771 B2 | 7/2011 | Geaghan |
| 7,978,281 B2 | 7/2011 | Vergith et al. |
| 8,016,255 B2 | 9/2011 | Lin |
| 8,018,386 B2 | 9/2011 | Qi et al. |
| 8,026,904 B2 | 9/2011 | Westerman |
| 8,053,688 B2 | 11/2011 | Conzola et al. |
| 8,065,624 B2 | 11/2011 | Morin et al. |
| 8,069,356 B2 | 11/2011 | Rathi et al. |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | McClure et al. |
| 8,120,166 B2 | 2/2012 | Koizumi et al. |
| 8,130,203 B2 | 3/2012 | Westerman |
| 8,154,524 B2 | 4/2012 | Wilson et al. |
| 8,162,282 B2 | 4/2012 | Hu et al. |
| D659,139 S | 5/2012 | Gengler |
| 8,169,421 B2 | 5/2012 | Wright et al. |
| 8,229,509 B2 | 7/2012 | Paek et al. |
| 8,229,522 B2 | 7/2012 | Kim et al. |
| 8,231,099 B2 | 7/2012 | Chen |
| 8,243,432 B2 | 8/2012 | Duan et al. |
| 8,248,791 B2 | 8/2012 | Wang et al. |
| 8,255,708 B1 | 8/2012 | Zhang |
| 8,264,310 B2 | 9/2012 | Lauder et al. |
| 8,267,368 B2 | 9/2012 | Torii et al. |
| 8,274,784 B2 | 9/2012 | Franz et al. |
| 8,279,589 B2 | 10/2012 | Kim |
| 8,322,290 B1 | 12/2012 | Mignano |
| 8,346,206 B1 | 1/2013 | Andrus et al. |
| 8,371,174 B2 | 2/2013 | Chen et al. |
| 8,384,566 B2 | 2/2013 | Bocirnea |
| 8,387,078 B2 | 2/2013 | Memmott |
| 8,387,938 B2 | 3/2013 | Lin |
| 8,403,576 B2 | 3/2013 | Merz |
| 8,416,559 B2 | 4/2013 | Agata et al. |
| 8,424,160 B2 | 4/2013 | Chen |
| 8,464,079 B2 | 6/2013 | Chueh et al. |
| 8,498,100 B1 | 7/2013 | Whitt, III et al. |
| 8,514,568 B2 | 8/2013 | Qiao et al. |
| 8,520,371 B2 | 8/2013 | Peng et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,570,725 B2 | 10/2013 | Whitt, III et al. |
| 8,582,280 B2 | 11/2013 | Ryu |
| 8,587,701 B2 | 11/2013 | Tatsuzawa |
| 8,599,542 B1 | 12/2013 | Healey et al. |
| 8,610,015 B2 | 12/2013 | Whitt et al. |
| 8,614,666 B2 | 12/2013 | Whitman et al. |
| 8,646,999 B2 | 2/2014 | Shaw et al. |
| 8,699,215 B2 | 4/2014 | Whitt, III et al. |
| 8,719,603 B2 | 5/2014 | Belesiu et al. |
| 8,724,302 B2 | 5/2014 | Whitt et al. |
| 8,744,070 B2 | 6/2014 | Zhang et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt, III et al. |
| 8,791,382 B2 | 7/2014 | Whitt, III et al. |
| 8,797,765 B2 | 8/2014 | Lin et al. |
| 8,825,187 B1 | 9/2014 | Hamrick et al. |
| 8,830,668 B2 | 9/2014 | Whit, III et al. |
| 8,891,232 B2 | 11/2014 | Wang |
| 8,908,858 B2 | 12/2014 | Chiu et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,864 B2 | 2/2015 | Whitt, III et al. |
| 8,949,477 B2 | 2/2015 | Drasnin |
| 8,952,892 B2 | 2/2015 | Chai |
| 8,964,376 B2 | 2/2015 | Chen et al. |
| 2001/0023818 A1 | 9/2001 | Masaru et al. |
| 2002/0005108 A1 | 1/2002 | Ludwig |
| 2002/0044216 A1 | 4/2002 | Cha |
| 2002/0070883 A1 | 6/2002 | Dosch |
| 2002/0134828 A1 | 9/2002 | Sandbach et al. |
| 2002/0135457 A1 | 9/2002 | Sandbach et al. |
| 2002/0195177 A1 | 12/2002 | Hinkley et al. |
| 2003/0007648 A1 | 1/2003 | Currell |
| 2003/0011576 A1 | 1/2003 | Sandbach et al. |
| 2003/0016282 A1 | 1/2003 | Koizumi |

(56) References Cited

U.S. PATENT DOCUMENTS

| | | |
|---|---|---|
| 2003/0051983 A1 | 3/2003 | Lahr |
| 2003/0067450 A1 | 4/2003 | Thursfield et al. |
| 2003/0108720 A1 | 6/2003 | Kashino |
| 2003/0163611 A1 | 8/2003 | Nagao |
| 2003/0173195 A1 | 9/2003 | Federspiel |
| 2003/0197687 A1 | 10/2003 | Shetter |
| 2003/0198008 A1 | 10/2003 | Leapman et al. |
| 2003/0231243 A1 | 12/2003 | Shibutani |
| 2004/0005184 A1 | 1/2004 | Kim et al. |
| 2004/0046796 A1 | 3/2004 | Fujita |
| 2004/0056843 A1 | 3/2004 | Lin et al. |
| 2004/0095333 A1 | 5/2004 | Morag et al. |
| 2004/0113956 A1 | 6/2004 | Bellwood et al. |
| 2004/0115994 A1 | 6/2004 | Wulff et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0212601 A1 | 10/2004 | Cake et al. |
| 2004/0231969 A1 | 11/2004 | Kitano et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0099400 A1 | 5/2005 | Lee |
| 2005/0134717 A1 | 6/2005 | Misawa |
| 2005/0146512 A1 | 7/2005 | Hill et al. |
| 2005/0236848 A1 | 10/2005 | Kim et al. |
| 2005/0264653 A1 | 12/2005 | Starkweather et al. |
| 2005/0264988 A1 | 12/2005 | Nicolosi |
| 2005/0283731 A1 | 12/2005 | Saint-Hilaire et al. |
| 2005/0285703 A1 | 12/2005 | Wheeler et al. |
| 2006/0049920 A1 | 3/2006 | Sadler et al. |
| 2006/0061555 A1 | 3/2006 | Mullen |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0125799 A1* | 6/2006 | Hillis et al. .................. 345/173 |
| 2006/0152499 A1 | 7/2006 | Roberts |
| 2006/0154725 A1 | 7/2006 | Glaser et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2007/0003267 A1 | 1/2007 | Shibutani |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0117600 A1 | 5/2007 | Robertson et al. |
| 2007/0121956 A1 | 5/2007 | Bai et al. |
| 2007/0145945 A1 | 6/2007 | McGinley et al. |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0200830 A1 | 8/2007 | Yamamoto |
| 2007/0220708 A1 | 9/2007 | Lewis |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247432 A1 | 10/2007 | Oakley |
| 2007/0260892 A1 | 11/2007 | Paul et al. |
| 2007/0283179 A1 | 12/2007 | Burnett et al. |
| 2007/0296709 A1 | 12/2007 | Guanghai |
| 2007/0297625 A1 | 12/2007 | Hjort et al. |
| 2008/0005423 A1 | 1/2008 | Jacobs et al. |
| 2008/0053222 A1 | 3/2008 | Ehrensvard et al. |
| 2008/0059888 A1 | 3/2008 | Dunko |
| 2008/0104437 A1 | 5/2008 | Lee |
| 2008/0129520 A1 | 6/2008 | Lee |
| 2008/0151478 A1 | 6/2008 | Chern |
| 2008/0158185 A1* | 7/2008 | Westerman .................. 345/173 |
| 2008/0167832 A1 | 7/2008 | Soss |
| 2008/0174570 A1 | 7/2008 | Jobs et al. |
| 2008/0186660 A1 | 8/2008 | Yang |
| 2008/0228969 A1 | 9/2008 | Cheah et al. |
| 2008/0238884 A1 | 10/2008 | Harish |
| 2008/0253822 A1 | 10/2008 | Matias |
| 2008/0297878 A1 | 12/2008 | Brown et al. |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0320190 A1 | 12/2008 | Lydon et al. |
| 2009/0009476 A1 | 1/2009 | Daley, III |
| 2009/0073957 A1 | 3/2009 | Newland et al. |
| 2009/0083562 A1 | 3/2009 | Park et al. |
| 2009/0089600 A1 | 4/2009 | Nousiainen |
| 2009/0096756 A1 | 4/2009 | Lube |
| 2009/0102805 A1 | 4/2009 | Meijer et al. |
| 2009/0127005 A1 | 5/2009 | Zachut et al. |
| 2009/0140985 A1 | 6/2009 | Liu |
| 2009/0163147 A1 | 6/2009 | Steigerwald et al. |
| 2009/0174687 A1 | 7/2009 | Ciesla et al. |
| 2009/0174759 A1 | 7/2009 | Yeh et al. |
| 2009/0187860 A1 | 7/2009 | Fleck et al. |
| 2009/0189873 A1 | 7/2009 | Peterson |
| 2009/0195497 A1 | 8/2009 | Fitzgerald et al. |
| 2009/0195518 A1 | 8/2009 | Mattice et al. |
| 2009/0207144 A1 | 8/2009 | Bridger |
| 2009/0231275 A1 | 9/2009 | Odgers |
| 2009/0239586 A1 | 9/2009 | Boeve et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0285491 A1 | 11/2009 | Ravenscroft et al. |
| 2009/0296331 A1 | 12/2009 | Choy |
| 2009/0303204 A1 | 12/2009 | Nasiri et al. |
| 2009/0315830 A1 | 12/2009 | Westerman |
| 2009/0320244 A1 | 12/2009 | Lin |
| 2009/0321490 A1 | 12/2009 | Groene et al. |
| 2010/0001963 A1 | 1/2010 | Doray et al. |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045609 A1 | 2/2010 | Do et al. |
| 2010/0045633 A1 | 2/2010 | Gettemy et al. |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0054435 A1 | 3/2010 | Louch et al. |
| 2010/0056130 A1 | 3/2010 | Louch et al. |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0081377 A1 | 4/2010 | Chatterjee et al. |
| 2010/0083108 A1 | 4/2010 | Rider et al. |
| 2010/0085321 A1 | 4/2010 | Pundsack |
| 2010/0102182 A1 | 4/2010 | Lin |
| 2010/0103112 A1 | 4/2010 | Yoo et al. |
| 2010/0105443 A1 | 4/2010 | Vaisanen |
| 2010/0106983 A1 | 4/2010 | Kasprzak et al. |
| 2010/0117993 A1 | 5/2010 | Kent |

(56) References Cited

U.S. PATENT DOCUMENTS

| | | | |
|---|---|---|---|
| 2010/0123686 | A1 | 5/2010 | Klinghult et al. |
| 2010/0133398 | A1 | 6/2010 | Chiu et al. |
| 2010/0142130 | A1 | 6/2010 | Wang et al. |
| 2010/0148995 | A1 | 6/2010 | Elias |
| 2010/0148999 | A1 | 6/2010 | Casparian et al. |
| 2010/0149104 | A1 | 6/2010 | Sim et al. |
| 2010/0149111 | A1 | 6/2010 | Olien |
| 2010/0149134 | A1 | 6/2010 | Westerman et al. |
| 2010/0149377 | A1 | 6/2010 | Shintani et al. |
| 2010/0156798 | A1 | 6/2010 | Archer |
| 2010/0156913 | A1 | 6/2010 | Ortega et al. |
| 2010/0161522 | A1 | 6/2010 | Tirpak et al. |
| 2010/0164857 | A1 | 7/2010 | Liu et al. |
| 2010/0164897 | A1 | 7/2010 | Morin et al. |
| 2010/0171891 | A1 | 7/2010 | Kaji et al. |
| 2010/0174421 | A1 | 7/2010 | Tsai et al. |
| 2010/0180063 | A1 | 7/2010 | Ananny et al. |
| 2010/0188299 | A1 | 7/2010 | Rinehart et al. |
| 2010/0205472 | A1 | 8/2010 | Tupman et al. |
| 2010/0206614 | A1 | 8/2010 | Park et al. |
| 2010/0206644 | A1 | 8/2010 | Yeh |
| 2010/0214257 | A1 | 8/2010 | Wussler et al. |
| 2010/0222110 | A1 | 9/2010 | Kim et al. |
| 2010/0231522 | A1 | 9/2010 | Li |
| 2010/0231556 | A1 | 9/2010 | Mines et al. |
| 2010/0235546 | A1 | 9/2010 | Terlizzi et al. |
| 2010/0238075 | A1 | 9/2010 | Pourseyed |
| 2010/0238620 | A1 | 9/2010 | Fish |
| 2010/0245221 | A1 | 9/2010 | Khan |
| 2010/0250988 | A1 | 9/2010 | Okuda et al. |
| 2010/0259482 | A1 | 10/2010 | Ball |
| 2010/0259876 | A1 | 10/2010 | Kim |
| 2010/0265182 | A1 | 10/2010 | Ball et al. |
| 2010/0271771 | A1 | 10/2010 | Wu et al. |
| 2010/0274932 | A1 | 10/2010 | Kose |
| 2010/0279768 | A1 | 11/2010 | Huang et al. |
| 2010/0289457 | A1 | 11/2010 | Onnerud et al. |
| 2010/0295812 | A1 | 11/2010 | Burns et al. |
| 2010/0302378 | A1 | 12/2010 | Marks et al. |
| 2010/0304793 | A1 | 12/2010 | Kim |
| 2010/0306538 | A1 | 12/2010 | Thomas et al. |
| 2010/0308778 | A1 | 12/2010 | Yamazaki et al. |
| 2010/0308844 | A1 | 12/2010 | Day et al. |
| 2010/0309617 | A1 | 12/2010 | Wang et al. |
| 2010/0313680 | A1 | 12/2010 | Joung et al. |
| 2010/0315348 | A1 | 12/2010 | Jellicoe et al. |
| 2010/0315373 | A1 | 12/2010 | Steinhauser et al. |
| 2010/0321877 | A1 | 12/2010 | Moser |
| 2010/0324457 | A1 | 12/2010 | Bean et al. |
| 2010/0325155 | A1 | 12/2010 | Skinner et al. |
| 2010/0331059 | A1 | 12/2010 | Apgar et al. |
| 2011/0012873 | A1 | 1/2011 | Prest et al. |
| 2011/0019123 | A1 | 1/2011 | Prest et al. |
| 2011/0031287 | A1 | 2/2011 | Le Gette et al. |
| 2011/0032127 | A1 | 2/2011 | Roush |
| 2011/0036965 | A1 | 2/2011 | Zhang et al. |
| 2011/0037721 | A1 | 2/2011 | Cranfill et al. |
| 2011/0043990 | A1 | 2/2011 | Mickey et al. |
| 2011/0050576 | A1 | 3/2011 | Forutanpour et al. |
| 2011/0050626 | A1 | 3/2011 | Porter et al. |
| 2011/0055407 | A1 | 3/2011 | Lydon et al. |
| 2011/0057724 | A1 | 3/2011 | Pabon |
| 2011/0060926 | A1 | 3/2011 | Brooks et al. |
| 2011/0069148 | A1 | 3/2011 | Jones et al. |
| 2011/0074688 | A1 | 3/2011 | Hull et al. |
| 2011/0102326 | A1 | 5/2011 | Casparian et al. |
| 2011/0102356 | A1 | 5/2011 | Kemppinen et al. |
| 2011/0102752 | A1 | 5/2011 | Chen et al. |
| 2011/0107958 | A1 | 5/2011 | Pance et al. |
| 2011/0113368 | A1 | 5/2011 | Carvajal et al. |
| 2011/0115738 | A1 | 5/2011 | Suzuki et al. |
| 2011/0117970 | A1 | 5/2011 | Choi |
| 2011/0134032 | A1* | 6/2011 | Chiu et al. ............ 345/157 |
| 2011/0134043 | A1 | 6/2011 | Chen |
| 2011/0157046 | A1 | 6/2011 | Lee et al. |
| 2011/0157087 | A1 | 6/2011 | Kanehira et al. |
| 2011/0163955 | A1 | 7/2011 | Nasiri et al. |
| 2011/0164370 | A1 | 7/2011 | McClure et al. |
| 2011/0167181 | A1 | 7/2011 | Minoo et al. |
| 2011/0167287 | A1 | 7/2011 | Walsh et al. |
| 2011/0167391 | A1 | 7/2011 | Momeyer et al. |
| 2011/0167992 | A1 | 7/2011 | Eventoff et al. |
| 2011/0169762 | A1 | 7/2011 | Weiss |
| 2011/0176035 | A1 | 7/2011 | Poulsen |
| 2011/0179864 | A1 | 7/2011 | Raasch et al. |
| 2011/0184646 | A1 | 7/2011 | Wong et al. |
| 2011/0184824 | A1 | 7/2011 | George et al. |
| 2011/0188199 | A1 | 8/2011 | Pan |
| 2011/0191480 | A1 | 8/2011 | Kobayashi |
| 2011/0193787 | A1 | 8/2011 | Morishige et al. |
| 2011/0205372 | A1 | 8/2011 | Miramontes |
| 2011/0221678 | A1 | 9/2011 | Davydov |
| 2011/0227913 | A1 | 9/2011 | Hyndman |
| 2011/0231682 | A1 | 9/2011 | Kakish et al. |
| 2011/0242138 | A1 | 10/2011 | Tribble |
| 2011/0248152 | A1 | 10/2011 | Svajda et al. |
| 2011/0248920 | A1 | 10/2011 | Larsen |
| 2011/0248941 | A1 | 10/2011 | Abdo et al. |
| 2011/0261001 | A1 | 10/2011 | Liu |
| 2011/0265287 | A1 | 11/2011 | Li et al. |
| 2011/0267272 | A1 | 11/2011 | Meyer et al. |
| 2011/0273475 | A1 | 11/2011 | Herz et al. |
| 2011/0290686 | A1 | 12/2011 | Huang |
| 2011/0295697 | A1 | 12/2011 | Boston et al. |
| 2011/0297566 | A1 | 12/2011 | Gallagher et al. |
| 2011/0298919 | A1 | 12/2011 | Maglaque |
| 2011/0302518 | A1 | 12/2011 | Zhang |
| 2011/0304577 | A1 | 12/2011 | Brown |
| 2011/0305875 | A1 | 12/2011 | Sanford et al. |
| 2011/0310038 | A1 | 12/2011 | Park et al. |
| 2011/0316807 | A1 | 12/2011 | Corrion |
| 2011/0320204 | A1 | 12/2011 | Locker et al. |
| 2012/0002820 | A1 | 1/2012 | Leichter |
| 2012/0007821 | A1 | 1/2012 | Zaliva |
| 2012/0011462 | A1 | 1/2012 | Westerman et al. |
| 2012/0013519 | A1 | 1/2012 | Hakansson et al. |
| 2012/0020490 | A1 | 1/2012 | Leichter |
| 2012/0023401 | A1 | 1/2012 | Arscott et al. |
| 2012/0023459 | A1 | 1/2012 | Westerman |
| 2012/0024682 | A1 | 2/2012 | Huang et al. |
| 2012/0026048 | A1 | 2/2012 | Vazquez et al. |
| 2012/0026096 | A1 | 2/2012 | Ku |
| 2012/0032887 | A1 | 2/2012 | Chiu et al. |
| 2012/0032891 | A1 | 2/2012 | Parivar |
| 2012/0032901 | A1 | 2/2012 | Kwon |
| 2012/0038495 | A1 | 2/2012 | Ishikawa |
| 2012/0038496 | A1 | 2/2012 | Edwards |
| 2012/0044179 | A1 | 2/2012 | Hudson |
| 2012/0047368 | A1 | 2/2012 | Chinn et al. |
| 2012/0050975 | A1 | 3/2012 | Garelli et al. |
| 2012/0062564 | A1 | 3/2012 | Miyashita |
| 2012/0068919 | A1 | 3/2012 | Lauder et al. |
| 2012/0069540 | A1 | 3/2012 | Lauder et al. |
| 2012/0075249 | A1 | 3/2012 | Hoch |
| 2012/0077384 | A1 | 3/2012 | Bar-Niv et al. |
| 2012/0081316 | A1 | 4/2012 | Sirpal et al. |
| 2012/0092279 | A1 | 4/2012 | Martin |
| 2012/0094257 | A1 | 4/2012 | Pillischer et al. |
| 2012/0099749 | A1 | 4/2012 | Rubin et al. |
| 2012/0103778 | A1 | 5/2012 | Obata et al. |
| 2012/0113137 | A1 | 5/2012 | Nomoto |
| 2012/0113579 | A1 | 5/2012 | Agata et al. |
| 2012/0115553 | A1 | 5/2012 | Mahe et al. |
| 2012/0117409 | A1 | 5/2012 | Lee et al. |
| 2012/0127118 | A1 | 5/2012 | Nolting et al. |
| 2012/0139727 | A1 | 6/2012 | Houvener et al. |
| 2012/0140396 | A1 | 6/2012 | Zeliff et al. |
| 2012/0145525 | A1 | 6/2012 | Ishikawa |
| 2012/0162693 | A1 | 6/2012 | Ito |
| 2012/0175487 | A1 | 7/2012 | Goto |
| 2012/0182242 | A1 | 7/2012 | Lindahl et al. |
| 2012/0182249 | A1 | 7/2012 | Endo et al. |
| 2012/0194393 | A1 | 8/2012 | Utterman et al. |
| 2012/0194448 | A1 | 8/2012 | Rothkopf |

(56) References Cited

U.S. PATENT DOCUMENTS

| | | |
|---|---|---|
| 2012/0212438 A1 | 8/2012 | Vaisanen |
| 2012/0218194 A1 | 8/2012 | Silverman |
| 2012/0221877 A1 | 8/2012 | Prabu |
| 2012/0223866 A1 | 9/2012 | Vazquez et al. |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0235635 A1 | 9/2012 | Sato |
| 2012/0242584 A1 | 9/2012 | Tuli |
| 2012/0243165 A1 | 9/2012 | Chang et al. |
| 2012/0246377 A1 | 9/2012 | Bhesania et al. |
| 2012/0249443 A1 | 10/2012 | Anderson et al. |
| 2012/0250873 A1 | 10/2012 | Bakalos et al. |
| 2012/0256959 A1 | 10/2012 | Ye et al. |
| 2012/0260177 A1 | 10/2012 | Sehrer |
| 2012/0274811 A1 | 11/2012 | Bakin |
| 2012/0298491 A1 | 11/2012 | Ozias et al. |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2013/0009413 A1 | 1/2013 | Chiu et al. |
| 2013/0015311 A1 | 1/2013 | Kim |
| 2013/0016468 A1 | 1/2013 | Oh |
| 2013/0027867 A1 | 1/2013 | Lauder et al. |
| 2013/0031353 A1 | 1/2013 | Noro |
| 2013/0044059 A1 | 2/2013 | Fu |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0069916 A1 | 3/2013 | Estéve |
| 2013/0073877 A1 | 3/2013 | Radke |
| 2013/0076617 A1 | 3/2013 | Csaszar et al. |
| 2013/0076635 A1 | 3/2013 | Lin |
| 2013/0082824 A1 | 4/2013 | Colley |
| 2013/0082950 A1 | 4/2013 | Lim et al. |
| 2013/0088431 A1 | 4/2013 | Ballagas et al. |
| 2013/0106766 A1 | 5/2013 | Yilmaz et al. |
| 2013/0107144 A1 | 5/2013 | Marhefka et al. |
| 2013/0135214 A1 | 5/2013 | Li et al. |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0217451 A1 | 8/2013 | Komiyama et al. |
| 2013/0226794 A1 | 8/2013 | Englebardt |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228435 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229350 A1 | 9/2013 | Shaw |
| 2013/0229351 A1 | 9/2013 | Whitt, III |
| 2013/0229354 A1 | 9/2013 | Whitt, III et al. |
| 2013/0229356 A1 | 9/2013 | Marwah |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0241860 A1 | 9/2013 | Ciesla et al. |
| 2013/0242495 A1 | 9/2013 | Bathiche et al. |
| 2013/0262886 A1 | 10/2013 | Nishimura |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0321992 A1 | 12/2013 | Liu et al. |
| 2013/0322000 A1 | 12/2013 | Whitt |
| 2013/0322001 A1 | 12/2013 | Whitt |
| 2013/0329360 A1 | 12/2013 | Aldana |
| 2013/0332628 A1 | 12/2013 | Panay |
| 2013/0339757 A1 | 12/2013 | Reddy |
| 2013/0342976 A1 | 12/2013 | Chung |
| 2014/0012401 A1 | 1/2014 | Perek |
| 2014/0043275 A1 | 2/2014 | Whitman |
| 2014/0048399 A1 | 2/2014 | Whitt, III |
| 2014/0078063 A1 | 3/2014 | Bathiche |
| 2014/0085814 A1 | 3/2014 | Kielland |
| 2014/0118241 A1 | 5/2014 | Chai |
| 2014/0119802 A1 | 5/2014 | Shaw |
| 2014/0132550 A1 | 5/2014 | McCracken et al. |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0362506 A1 | 12/2014 | Whitt, III et al. |
| 2014/0379942 A1 | 12/2014 | Perek et al. |
| 2015/0005953 A1 | 1/2015 | Fadell et al. |
| 2015/0036274 A1 | 2/2015 | Belesiu et al. |

FOREIGN PATENT DOCUMENTS

| | | |
|---|---|---|
| CN | 101681189 | 3/2010 |
| CN | 103455149 | 12/2013 |
| EP | 1223722 | 7/2002 |
| EP | 1591891 | 11/2005 |
| EP | 2026178 | 2/2009 |
| EP | 2353978 | 8/2011 |
| GB | 2123213 | 1/1984 |
| JP | 56108127 | 8/1981 |
| JP | 10326124 | 12/1998 |
| JP | 1173239 | 3/1999 |
| JP | 11338575 | 12/1999 |
| JP | 2000010654 | 1/2000 |
| JP | 2001142564 | 5/2001 |
| JP | 2004038950 | 2/2004 |
| JP | 2006163459 | 6/2006 |
| JP | 2006294361 | 10/2006 |
| JP | 2010244514 | 10/2010 |
| KR | 20010107055 | 12/2001 |
| KR | 20040066647 | 7/2004 |
| KR | 20050014299 | 2/2005 |
| KR | 20060003093 | 1/2006 |
| KR | 20080006404 | 1/2008 |
| KR | 20090029411 | 3/2009 |
| KR | 20100022059 | 2/2010 |
| KR | 20100067366 | 6/2010 |
| KR | 20100115675 | 10/2010 |
| KR | 102011008717 | 8/2011 |
| KR | 20110109791 | 10/2011 |
| KR | 20110120002 | 11/2011 |
| KR | 20110122333 | 11/2011 |
| KR | 101113530 | 2/2012 |
| WO | WO-9919995 | 4/1999 |
| WO | WO-2006044818 | 4/2006 |
| WO | WO-2007112172 | 10/2007 |

(56) References Cited

FOREIGN PATENT DOCUMENTS

| WO | WO-2009034484 | 3/2009 |
|---|---|---|
| WO | WO-2011049609 | 4/2011 |

OTHER PUBLICATIONS

"Accessing Device Sensors", retrieved from <https://developer.palm.com/content/api/dev-guide/pdk/accessing-device-sensors.html> on May 25, 2012, 4 pages.

"ACPI Docking for Windows Operating Systems", Retrieved from: <http://www.scritube.com/limba/engleza/software/ACPI-Docking-for-Windows-Opera331824193.php> on Jul. 6, 2012, 10 pages.

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Available at Technology", *Interlink Electronics*, <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009), 2 pages.

"Motion Sensors", *Android Developers*, retrieved from <http://developerandroid.com/guide/topics/sensors/sensors_motion.html> on May 25, 2012, 7 pages.

"Position Sensors", *Android Developers*, retrieved from <http://developer.android.com/guide/topics/sensors/sensors_position.html> on May 25, 2012, 5 pages.

"SolRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012,(2011), 4 pages.

"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.

Block, Steve et al., "DeviceOrientation Event Specification", *W3C, Editor's Draft*, retrieved from <https://developer.palm.com/content/api/dev-guide/pdk/accessing-device-sensors.html> on May 25, 2012,(Jul. 12, 2011), 14 pages.

Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.

Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.

Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.

Dietz, Paul H., et al., "A Practical Pressure Sensitive Computer Keyboard", In Proceedings of UIST 2009,(Oct. 2009), 4 pages.

Glatt, Jeff "Channel and Key Pressure (Aftertouch).", Retrieved from: <http://home.roadrunner.com/~jgglatt/tutr/touch.htm> on Jun. 11, 2012, 2 pages.

Hanlon, Mike "ElekTex Smart Fabric Keyboard Goes Wireless", Retrieved from: <http://www.gizmag.com/go/5048/ > on May 7, 2012,(Jan. 15, 2006), 5 pages.

Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.

Khuntontong, Puttachat et al., "Fabrication of Molded Interconnection Devices By Ultrasonic Hot Embossing on Thin Polymer Films", IEEE Transactions on Electronics Packaging Manufacturing, vol. 32, No. 3,(Jul. 2009), pp. 152-156.

Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.

McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.

Post, E.R. et al., "E-Broidery: Design and Fabrication of Textile-Based Computing", IBM Systems Journal, vol. 39, Issue 3 & 4,(Jul. 2000), pp. 840-860.

Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.

Takamatsu, Seiichi et al., "Flexible Fabric Keyboard with Conductive Polymer-Coated Fibers", In Proceedings of Sensors 2011,(Oct. 28, 2011), 4 pages.

Zhang, et al., "Model-Based Development of Dynamically Adaptive Software", *In Proceedings of ICSE 2006*, Available at http://www.irisa.fr/lande/lande/icse-proceedings/icse/p371.pdf>,(May 20, 2006), pp. 371-380.

"Cholesteric Liquid Crystal", Retrieved from: <http://en.wikipedia.org/wiki/Cholesteric_liquid_crystal> on Aug. 6, 2012,(Jun. 10, 2012), 2 pages.

"Corrected Notice of Allowance", U.S. Appl. No. 13/470,633, (Apr. 9, 2013), 2 pages.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.

"Final Office Action", U.S. Appl. No. 13/651,195, (Apr. 18, 2013),13 pages.

"i-Interactor electronic pen", Retrieved from: <http://www.alibaba.com/product-gs/331004878/i_Interactor_electronic_pen.html> on Jun. 19, 2012, 5 pages.

"MPC Fly Music Production Controller", *Akai Professional*, Retrieved from: <http://www.akaiprompc.com/mpc-fly> on Jul. 9, 2012, 4 pages.

"NI Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/471,139, (Mar. 21, 2013),12 pages.

"Non-Final Office Action", U.S. Appl. No. 13/651,304, (Mar. 22, 2013), 9 pages.

"Non-Final Office Action", U.S. Appl. No. 13/651,327, (Mar. 22, 2013), 6 pages.

"Non-Final Office Action", U.S. Appl. No. 13/651,726, (Apr. 15, 2013), 6 pages.

"Non-Final Office Action", U.S. Appl. No. 13/656,055, (Apr. 23, 2013),11 pages.

"Notice of Allowance", U.S. Appl. No. 13/470,633, (Mar. 22, 2013), 7 pages.

"Reflex LCD Writing Tablets", retrieved from <http://www.kentdisplays.com/products/lcdwritingtablets.html> on Jun. 27, 2012, 3 pages.

"Smart Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009), 2 pages.

"Tilt Shift Lenses: Perspective Control", retrieved from http://www.cambridgeincolour.com/tutorials/tilt-shift-lenses1.htm, (Mar. 28, 2008), 11 Pages.

"What is Active Alignment?", http://www.kasalis.com/active_alignment.html, retrieved on Nov. 22, 2012, 2 Pages.

(56) References Cited

OTHER PUBLICATIONS

Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages.
Iwase, Eiji "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> *Proceedings: Journal of Microelectromechanical Systems*, (Dec. 2005), 7 pages.
Qin, Yongqiang et al., "pPen: Enabling Authentucated Pen and Touch Interaction on Tabletop Surfaces", *In Proceedings of ITS 2010*, Available at <http://www.dfki.de/its2010/papers/pdf/po172.pdf>,(Nov. 2010), pp. 283-284.
Sumimoto, Mark "Touch & Write: Surface Computing with Touch and Pen Input", Retrieved from: <http://www.gottabemobile.com/2009/08/07/touch-write-surface-computing-with-touch-and-pen-input/> on Jun. 19, 2012,(Aug. 7, 2009), 4 pages.
Valliath, G T., "Design of Hologram for Brightness Enhancement in Color LCDs", Retrieved from <http://www.loreti.it/Download/PDF/LCD/44_05.pdf> on Sep. 17, 2012, 5 pages.
Williams, Jim "A Fourth Generation of LCD Backlight Technology", Retrieved from <http://cds.linear.com/docs/Application%20Note/an65f.pdf>, (Nov. 1995), 124 pages.
"Cirago Slim Case®—Protective case with built-in kickstand for your iPhone 5®", Retrieved from <http://cirago.com/wordpress/wp-page.content/uploads/2012/10/ipc1500brochure1.pdf> on Jan. 29, 2013, (Jan. 2013), 1 page.
"How to Use the iPad's Onscreen Keyboard", Retrieved from <http://www.dummies.com/how-to/content/how-to-use-the-ipads-onscreen-keyboard.html> on Aug. 28, 2012, 3 pages.
"Non-Final Office Action", U.S. Appl. No. 13/471,001, (Feb. 19, 2013),15 pages.
"Non-Final Office Action", U.S. Appl. No. 13/471,202, (Feb. 11, 2013),10 pages.
"Non-Final Office Action", U.S. Appl. No. 13/471,336, (Jan. 18, 2013),14 pages.
"Non-Final Office Action", U.S. Appl. No. 13/651,195, (Jan. 2, 2013),14 pages.
"Non-Final Office Action", U.S. Appl. No. 13/651,272, (Feb. 12, 2013),10 pages.
"Non-Final Office Action", U.S. Appl. No. 13/651,287, (Jan. 29, 2013),13 pages.
"Non-Final Office Action", U.S. Appl. No. 13/651,871, (Mar. 18, 2013),14 pages.
"Non-Final Office Action", U.S. Appl. No. 13/651,976, (Feb. 22, 2013),16 pages.
"Non-Final Office Action", U.S. Appl. No. 13/653,321, (Feb. 1, 2013),13 pages.
"Non-Final Office Action", U.S. Appl. No. 13/653,682, (Feb. 7, 2013),11 pages.
"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.
"The Microsoft Surface Tablets Comes With Impressive Design and Specs", Retrieved from <http://microsofttabletreview.com/the-microsoft-surface-tablets-comes-with-impressive-design-and-specs> on Oct. 30, 2013, (Jun. 2012),2 pages.
Piltch, Avram "ASUS Eee Pad Slider SL101 Review", Retrieved from <http://www.laptopmag.com/review/tablets/asus-eee-pad-slider-sl101.aspx>, (Sep. 22, 2011), 5 pages.
"Final Office Action", U.S. Appl. No. 13/653,321, (Aug. 2, 2013),17 pages.
"Non-Final Office Action", U.S. Appl. No. 13/656,520, (Feb. 1, 2013),15 pages.
Hinckley, Ken et al., "Codex: A Dual Screen Tablet Computer", *Conference on Human Factors in Computing Systems*, (Apr. 9, 2009), 10 pages.
Li, et al., "Characteristic Mode Based Tradeoff Analysis of Antenna-Chassis Interactions for Multiple Antenna Terminals",*In IEEE Transactions on Antennas and Propagation*, Retrieved from <http://ieeexplore.ieee.org/stamp/stamp.jsp?tp=&arnumber=6060882>,(Feb. 2012),13 pages.
"Corrected Notice of Allowance", U.S. Appl. No. 13/470,633, (Jul. 2, 2013), 2 pages.
"Final Office Action", U.S. Appl. No. 13/471,001, (Jul. 25, 2013), 20 pages.
"Final Office Action", U.S. Appl. No. 13/651,287, (May 3, 2013),16 pages.
"Final Office Action", U.S. Appl. No. 13/651,976, (Jul. 25, 2013), 21 pages.
"Non-Final Office Action", U.S. Appl. No. 13/527,263, (Jul. 19, 2013), 5 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,871, (Jul. 1, 2013), 5 pages.
"Non-Final Office Action", U.S. Appl. No. 13/653,682, (Jun. 3, 2013),14 pages.
"Notice of Allowance", U.S. Appl. No. 13/471,202, (May 28, 2013), 7 pages.
"Notice of Allowance", U.S. Appl. No. 13/651,195, (Jul. 8, 2013), 9 pages.
"Notice of Allowance", U.S. Appl. No. 13/651,272, (May 2, 2013), 7 pages.
"Notice of Allowance", U.S. Appl. No. 13/651,304, (Jul. 1, 2013), 5 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
"PCT Search Report and Written Opinion", Application No. PCT/US2013/029461, (Jun. 21, 2013),11 pages.
"PCT Search Report and Written Opinion", Application No. PCT/US2013/028948, (Jun. 21, 2013),11 pages.
"Advanced Configuration and Power Management Specification", *Intel Corporation, Microsoft Corporation, Toshiba Corp. Revision 1*, (Dec. 22, 1996), 364 pages.
"Corrected Notice of Allowance", U.S. Appl. No. 13/651,327, (Sep. 12, 2013), 2 pages.
"Corrected Notice of Allowance", U.S. Appl. No. 13/651,327, (Sep. 23, 2013), 2 pages.
"Corrected Notice of Allowance", U.S. Appl. No. 13/651,726, (Sep. 17, 2013), 2 pages.
"Final Office Action", U.S. Appl. No. 13/471,139, (Sep. 16, 2013),13 pages.
"Final Office Action", U.S. Appl. No. 13/471,336, (Aug. 28, 2013),18 pages.
"Final Office Action", U.S. Appl. No. 13/653,682, (Oct. 18, 2013),16 pages.
"Final Office Action", U.S. Appl. No. 13/656,055, (Oct. 23, 2013),14 pages.
"Final Office Action", U.S. Appl. No. 13/938,930, (Nov. 8, 2013),10 pages.
"Final Office Action", U.S. Appl. No. 13/939,002, (Nov. 8, 2013), 7 pages.
"International Search Report and Written Opinion", Application No. PCT/US2013/040968, (Sep. 5, 2013), 12 pages.
"International Search Report and Written Opinion", Application No. PCT/US2013/045049, (Sep. 16, 2013), 9 pages.

(56) References Cited

OTHER PUBLICATIONS

"International Search Report and Written Opinion", Application No. PCT/US2013/042550, (Sep. 24, 2013), 14 pages.
"Non-Final Office Action", U.S. Appl. No. 13/780,228, (Oct. 30, 2013),12 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"Notice of Allowance", U.S. Appl. No. 13/563,435, (Nov. 12, 2013), 5 pages.
"Notice of Allowance", U.S. Appl. No. 13/651,871, (Oct. 2, 2013), 7 pages.
"Notice to Grant", CN Application No. 201320097089.9, (Sep. 29, 2013), 2 Pages.
"Notice to Grant", CN Application No. 201320097124.7, (Oct. 8, 2013), 2 pages.
"Welcome to Windows 7", Retrieved from: <http://www.microsoft.com/en-us/download/confirmation.aspx?id=4984> on Aug. 1, 2013, (Sep. 16, 2009), 3 pages.
Prospero, Michael "Samsung Outs Series 5 Hybrid PC Tablet", Retrieved from: <http://blog.laptopmag.com/samsunq-outs-series-5-hybrid-pc-tablet-running-windows-8> on Oct. 31, 2013, (Jun. 4, 2012), 7 pages.
"Non-Final Office Action", U.S. Appl. No. 14/063,912, Jan. 2, 2014, 10 pages.
"Non-Final Office Action", U.S. Appl. No. 13/468,918, Dec. 26, 2013, 18 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Notice of Allowance", U.S. Appl. No. 13/653,321, Dec. 18, 2013, 4 pages.
"Non-Final Office Action", U.S. Appl. No. 13/564,520, Feb. 14, 2014, 5 pages.
"Foreign Office Action", CN Application No. 201320097066.8, Oct. 24, 2013, 5 Pages.
"Non-Final Office Action", U.S. Appl. No. 13/939,002, Dec. 20, 2013, 5 pages.
"Final Office Action", U.S. Appl. No. 13/939,032, Dec. 20, 2013, 5 pages.
"Restriction Requirement", U.S. Appl. No. 13/468,918, Nov. 29, 2013, 6 pages.
"Notice of Allowance", U.S. Appl. No. 13/565,124, Dec. 24, 2013, 6 pages.
"Final Office Action", U.S. Appl. No. 13/564,520, Jan. 15, 2014, 7 pages.
"Advisory Action", U.S. Appl. No. 13/939,032, Feb. 24, 2014, 2 pages.
"Corrected Notice of Allowance", U.S. Appl. No. 13/563,435, Mar. 20, 2014, 2 pages.
"Corrected Notice of Allowance", U.S. Appl. No. 13/565,124, Apr. 3, 2014, 4 pages.
"Final Office Action", U.S. Appl. No. 13/780,228, Mar. 28, 2014, 13 pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"Non-Final Office Action", U.S. Appl. No. 13/599,635, Feb. 25, 2014, 13 pages.
"Non-Final Office Action", U.S. Appl. No. 13/471,186, Feb. 27, 2014, 8 pages.
"Non-Final Office Action", U.S. Appl. No. 13/471,237, Mar. 24, 2014, 7 pages.
"Non-Final Office Action", U.S. Appl. No. 13/471,376, Apr. 2, 2014, 17 pages.
"Non-Final Office Action", U.S. Appl. No. 13/471,405, Feb. 20, 2014, 37 pages.
"Non-Final Office Action", U.S. Appl. No. 13/527,263, Apr. 3, 2014, 6 pages.
"Non-Final Office Action", U.S. Appl. No. 13/653,682, Feb. 26, 2014, 10 pages.
"Non-Final Office Action", U.S. Appl. No. 13/656,055, Mar. 12, 2014, 17 pages.
"Notice of Allowance", U.S. Appl. No. 13/471,139, Mar. 17, 2014, 4 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Supplemental Notice of Allowance", U.S. Appl. No. 13/653,321, Mar. 28, 2014, 4 pages.
"Advisory Action", U.S. Appl. No. 14/199,924, filed May 28, 2014, 2 pages.
"Corrected Notice of Allowance", U.S. Appl. No. 13/565,124, filed Mar. 10, 2014, 2 pages.
"Corrected Notice of Allowance", U.S. Appl. No. 13/565,124, filed Apr. 14, 2014, 2 pages.
"Corrected Notice of Allowance", U.S. Appl. No. 13/938,930, filed May 6, 2014, 2 pages.
"Corrected Notice of Allowance", U.S. Appl. No. 13/938,930, filed Jun. 6, 2014, 2 pages.
"Corrected Notice of Allowance", U.S. Appl. No. 13/939,002, filed May 22, 2014, 2 pages.
"Corrected Notice of Allowance", U.S. Appl. No. 13/939,002, filed May 5, 2014, 2 pages.
"Final Office Action", U.S. Appl. No. 14/063,912, filed Apr. 29, 2014, 10 pages.
"Final Office Action", U.S. Appl. No. 14/199,924, filed May 6, 2014, 5 pages.
"International Search Report and Written Opinion", Application No. PCT/US2014/013928, May 12, 2014, 17 pages.
"International Search Report and Written Opinion", Application No. PCT/US2013/067905, Apr. 15, 2014, 9 pages.
"Non-Final Office Action", U.S. Appl. No. 13/471,030, filed May 15, 2014, 10 pages.
"Non-Final Office Action", U.S. Appl. No. 13/471,054, filed Jun. 3, 2014, 15 pages.
"Non-Final Office Action", U.S. Appl. No. 13/471,336, filed May 7, 2014, 17 pages.
"Non-Final Office Action", U.S. Appl. No. 13/492,232, filed Apr. 30, 2014, 9 pages.
"Non-Final Office Action", U.S. Appl. No. 14/199,924, filed Apr. 10, 2014, 6 pages.
"Non-Final Office Action", U.S. Appl. No. 14/200,595, filed Apr. 11, 2014, 4 pages.
"Notice of Allowance", U.S. Appl. No. 13/471,237, filed May 12, 2014, 8 pages.
"Notice of Allowance", U.S. Appl. No. 13/651,287, filed May 2, 2014, 6 pages.
"Notice of Allowance", U.S. Appl. No. 14/018,286, filed May 23, 2014, 8 pages.
"Notice of Allowance", U.S. Appl. No. 14/199,924, filed Jun. 10, 2014, 4 pages.
"Restriction Requirement", U.S. Appl. No. 13/595,700, filed May 28, 2014, 6 pages.
"International Search Report & Written Opinion for PCT Patent Application No. PCT/US2013/028483", Mailed Date: Jun. 24, 2014, Filed Date: Mar. 1, 2013, 10 pages.
"Corrected Notice of Allowance", U.S. Appl. No. 13/471,030, filed Sep. 30, 2014, 2 pages.
"Corrected Notice of Allowance", U.S. Appl. No. 14/199,924, filed Sep. 19, 2014, 2 pages.
"Final Office Action", U.S. Appl. No. 13/468,949, filed Oct. 6, 2014, 11 pages.
"Final Office Action", U.S. Appl. No. 13/471,054, filed Oct. 23, 2014, 17 pages.

(56) References Cited

OTHER PUBLICATIONS

"Final Office Action", U.S. Appl. No. 13/471,336, filed Oct. 6, 2014, 13 pages.
"Final Office Action", U.S. Appl. No. 13/492,232, filed Nov. 17, 2014, 13 pages.
"Final Office Action", U.S. Appl. No. 13/595,700, filed Oct. 9, 2014, 8 pages.
"Final Office Action", U.S. Appl. No. 13/656,055, filed Sep. 17, 2014, 10 pages.
"Final Office Action", U.S. Appl. No. 14/200,595, filed Nov. 19, 2014, 5 pages.
"International Search Report and Written Opinion", Application No. PCT/US2014/043546, Oct. 9, 2014, 10 pages.
"Non-Final Office Action", U.S. Appl. No. 13/471,393, filed Oct. 20, 2014, 12 pages.
"Non-Final Office Action", U.S. Appl. No. 13/780,228, filed Sep. 15, 2014, 18 pages.
"Notice of Allowance", U.S. Appl. No. 13/653,682, filed Sep. 24, 2014, 4 pages.
"Notice of Allowance", U.S. Appl. No. 14/277,240, filed Sep. 16, 2014, 4 pages.
"Restriction Requirement", U.S. Appl. No. 13/653,218, filed Nov. 7, 2014, 6 pages.
"Written Opinoin", PCT Application No. PCT/US2014/013928, Oct. 22, 2014, 13 Pages.
Harrison, "UIST 2009 Student Innovation Contest—Demo Video", Retrieved From: <https://www.youtube.com/watch?v=PD18eYIASf0> Sep. 16, 2014, Jul. 23, 2009, 1 pages.
"Final Office Action", U.S. Appl. No. 13/468,882, filed Feb. 12, 2015, 9 pages.
"Final Office Action", U.S. Appl. No. 13/527,263, filed Jan. 27, 2015, 7 pages.
"First Examination Report", NZ Application No. 628690, Nov. 27, 2014, 2 pages.
"Non-Final Office Action", U.S. Appl. No. 13/492,232, filed Feb. 24, 2015, 12 pages.
"Non-Final Office Action", U.S. Appl. No. 13/564,520, filed Jan. 26, 2015, 6 pages.
"Non-Final Office Action", U.S. Appl. No. 13/599,635, filed Feb. 12, 2015, 16 pages.
"Non-Final Office Action", U.S. Appl. No. 14/147,252, filed Feb. 23, 2015, 11 pages.
"Notice of Allowance", U.S. Appl. No. 14/200,595, filed Feb. 17, 2015, 2 pages.
"Notice of Allowance", U.S. Appl. No. 14/200,595, filed Feb. 25, 2015, 4 pages.
"Corrected Notice of Allowance", U.S. Appl. No. 13/651,287, filed Aug. 21, 2014, 2 pages.
"Corrected Notice of Allowance", U.S. Appl. No. 14/199,924, filed Aug. 29, 2014, 2 pages.
"Corrected Notice of Allowance", U.S. Appl. No. 14/199,924, filed Sep. 5, 2014, 2 pages.
"Final Office Action", U.S. Appl. No. 13/471,376, filed Aug. 18, 2014, 24 pages.
"Final Office Action", U.S. Appl. No. 13/595,700, filed Aug. 15, 2014, 6 pages.
"Foreign Notice of Allowance", CN Application No. 201320097065.3, Nov. 21, 2013, 2 pages.
"Foreign Office Action", CN Application No. 201320097065.3, Jun. 18, 2013, 2 pages.
"Non-Final Office Action", U.S. Appl. No. 13/471,282, filed Sep. 3, 2014, 13 pages.
"Non-Final Office Action", U.S. Appl. No. 14/063,912, filed Sep. 2, 2014, 11 pages.
"Notice of Allowance", U.S. Appl. No. 13/471,030, filed Sep. 5, 2014, 6 pages.
"Notice of Allowance", U.S. Appl. No. 13/666,958, filed Aug. 29, 2014, 9 pages.
"Restriction Requirement", U.S. Appl. No. 13/653,184, filed Sep. 5, 2014, 6 pages.
"Supplemental Notice of Allowance", U.S. Appl. No. 13/471,405, filed Aug. 29, 2014, 5 pages.
"Final Office Action", U.S. Appl. No. 13/599,635, filed Aug. 8, 2014, 16 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"Non-Final Office Action", U.S. Appl. No. 13/712,111, filed Aug. 1, 2014, 11 pages.
"Corrected Notice of Allowance", U.S. Appl. No. 14/277,240, filed Jan. 8, 2015, 2 pages.
"Final Office Action", U.S. Appl. No. 13/470,951, filed Jan. 12, 2015, 20 pages.
"Final Office Action", U.S. Appl. No. 13/471,412, filed Dec. 15, 2014, 11 pages.
"Final Office Action", U.S. Appl. No. 13/647,479, filed Dec. 12, 2014, 12 pages.
"Final Office Action", U.S. Appl. No. 13/712,111, filed Dec. 18, 2014, 13 pages.
"Final Office Action", U.S. Appl. No. 14/063,912, filed Jan. 12, 2015, 12 pages.
"Final Office Action", U.S. Appl. No. 14/225,276, filed Dec. 17, 2014, 6 pages.
"Foreign Office Action", CN Application No. 201320097079.5, Jul. 28, 2014, 4 pages.
"Non-Final Office Action", U.S. Appl. No. 13/471,030, filed Jan. 15, 2015, 7 pages.
"Non-Final Office Action", U.S. Appl. No. 13/525,614, filed Nov. 24, 2014, 19 pages.
"Non-Final Office Action", U.S. Appl. No. 13/653,184, filed Dec. 1, 2014, 7 pages.
"Notice of Allowance", U.S. Appl. No. 13/595,700, filed Jan. 21, 2015, 4 pages.
"Notice of Allowance", U.S. Appl. No. 13/651,976, filed Jan. 21, 2015, 10 pages.
"Restriction Requirement", U.S. Appl. No. 14/147,252, filed Dec. 1, 2014, 6 pages.
"Supplemental Notice of Allowance", U.S. Appl. No. 13/471,405, filed Dec. 17, 2014, 5 pages.
"Corrected Notice of Allowance", U.S. Appl. No. 13/939,002, filed Jun. 19, 2014, 2 pages.

(56) References Cited

OTHER PUBLICATIONS

"Corrected Notice of Allowance", U.S. Appl. No. 13/939,032, filed Jun. 26, 2014, 2 pages.
"Corrected Notice of Allowance", U.S. Appl. No. 13/939,032, filed Jul. 15, 2014, 2 pages.
"Final Office Action", U.S. Appl. No. 13/653,682, filed Jun. 11, 2014, 11 pages.
"International Search Report and Written Opinion", Application No. PCT/US2014/031531, Jun. 20, 2014, 10 Pages.
"Non-Final Office Action", U.S. Appl. No. 13/468,882, filed Jul. 9, 2014, 9 pages.
"Non-Final Office Action", U.S. Appl. No. 13/468,949, filed Jun. 20, 2014, 10 pages.
"Non-Final Office Action", U.S. Appl. No. 13/470,951, filed Jul. 2, 2014, 19 pages.
"Non-Final Office Action", U.S. Appl. No. 13/471,001, filed Jun. 17, 2014, 23 pages.
"Non-Final Office Action", U.S. Appl. No. 13/471,412, filed Jul. 11, 2014, 22 pages.
"Non-Final Office Action", U.S. Appl. No. 13/564,520, filed Jun. 16, 2014, 5 pages.
"Non-Final Office Action", U.S. Appl. No. 13/595,700, filed Jun. 18, 2014, 8 pages.
"Non-Final Office Action", U.S. Appl. No. 13/647,479, filed Jul. 3, 2014, 10 pages.
"Non-Final Office Action", U.S. Appl. No. 13/651,976, filed Jun. 16, 2014, 23 pages.
"Non-Final Office Action", U.S. Appl. No. 14/225,250, filed Jun. 17, 2014, 5 pages.
"Non-Final Office Action", U.S. Appl. No. 14/225,276, filed Jun. 13, 2014, 6 pages.
"Non-Final Office Action", U.S. Appl. No. 14/277,240, filed Jun. 13, 2014, 6 pages.
"Notice of Allowance", U.S. Appl. No. 13/468,918, filed Jun. 17, 2014, 5 pages.
"Notice of Allowance", U.S. Appl. No. 13/471,186, filed Jul. 3, 2014, 7 pages.
"Notice of Allowance", U.S. Appl. No. 13/471,405, filed Jun. 24, 2014, 9 pages.
"Supplemental Notice of Allowance", U.S. Appl. No. 14/018,286, filed Jun. 11, 2014, 5 pages.
"Corrected Notice of Allowance", U.S. Appl. No. 13/656,055, filed Apr. 13, 2015, 2 pages.
"Final Office Action", U.S. Appl. No. 13/525,614, filed Apr. 29, 2015, 20 pages.
"Final Office Action", U.S. Appl. No. 13/780,228, filed Apr. 10, 2015, 19 pages.
"Final Office Action", U.S. Appl. No. 14/225,250, filed Mar. 13, 2015, 7 pages.
"Foreign Notice on Reexamination", CN Application No. 201320097066.8, Apr. 3, 2015, 7 Pages.
"Non-Final Office Action", U.S. Appl. No. 13/471,054, filed Mar. 13, 2015, 18 pages.
"Non-Final Office Action", U.S. Appl. No. 13/471,376, filed Mar. 27, 2015, 28 pages.
"Non-Final Office Action", U.S. Appl. No. 13/471,393, filed Mar. 26, 2015, 13 pages.
"Non-Final Office Action", U.S. Appl. No. 13/647,479, filed Apr. 28, 2015, 11 pages.
"Non-Final Office Action", U.S. Appl. No. 13/653,218, filed Mar. 4, 2015, 16 pages.
"Non-Final Office Action", U.S. Appl. No. 13/852,848, filed Mar. 26, 2015, 7 pages.
"Non-Final Office Action", U.S. Appl. No. 13/926,944, filed Apr. 23, 2015, 6 pages.
"Non-Final Office Action", U.S. Appl. No. 14/059,280, filed Mar. 3, 2015, 18 pages.
"Non-Final Office Action", U.S. Appl. No. 14/063,912, filed May 7, 2015, 12 pages.
"Non-Final Office Action", U.S. Appl. No. 14/225,276, filed Apr. 23, 2015, 7 pages.
"Notice of Allowance", U.S. Appl. No. 13/468,949, filed Apr. 24, 2015, 9 pages.
"Notice of Allowance", U.S. Appl. No. 13/468,918, filed Apr. 8, 2015, 7 pages.
"Notice of Allowance", U.S. Appl. No. 13/468,949, filed Apr. 24, 2015, 8 pages.
"Notice of Allowance", U.S. Appl. No. 13/471,030, filed Apr. 6, 2015, 6 pages.
"Notice of Allowance", U.S. Appl. No. 13/471,282, filed Apr. 30, 2015, 8 pages.
"Notice of Allowance", U.S. Appl. No. 13/564,520, filed May 8, 2015, 4 pages.
"Notice of Allowance", U.S. Appl. No. 13/653,184, filed Mar. 10, 2015, 6 pages.
"Notice of Allowance", U.S. Appl. No. 13/656,055, filed Mar. 4, 2015, 7 pages.
"Supplemental Notice of Allowance", U.S. Appl. No. 13/595,700, filed Apr. 10, 2015, 2 pages.
"Supplemental Notice of Allowance", U.S. Appl. No. 13/595,700, filed May 4, 2015, 2 pages.
"Supplemental Notice of Allowance", U.S. Appl. No. 13/595,700, filed May 22, 2015, 2 pages.
"Supplemental Notice of Allowance", U.S. Appl. No. 13/656,055, filed May 15, 2015, 2 pages.
Schafer, "Using Interactive Maps for Navigation and Collaboration", CHI '01 Extended Abstracts on Human Factors in Computing Systems, Mar. 31, 2001, 2 pages.
"Foreign Office Action", CN Application No. 201310067808.7, May 28, 2015, 14 Pages.
"Supplemental Notice of Allowance", U.S. Appl. No. 13/468,918, filed Jun. 4, 2015, 2 pages.
"Supplemental Notice of Allowance", U.S. Appl. No. 13/468,949, filed Jun. 5, 2015, 2 pages.
"Supplemental Notice of Allowance", U.S. Appl. No. 13/656,055, filed Jun. 10, 2015, 2 pages.
"Corrected Notice of Allowance", U.S. Appl. No. 14/200,595, filed Jun. 4, 2015, 3 pages.
"Non-Final Office Action", U.S. Appl. No. 13/471,412, filed Jun. 1, 2015, 31 pages.

* cited by examiner

CLASSIFYING THE INTENT OF USER INPUT

RELATED APPLICATIONS

This application is a continuation of and claims priority to U.S. patent application Ser. No. 13/471,336, filed May 14, 2012, entitled "Classifying The Intent Of User Input" and further claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Computing devices oftentimes have multiple different types of input mechanisms. These input mechanisms can include, for example, keyboards, virtual keyboards, mice, track pads, and so forth. Although these different types of mechanisms provide multiple input options for the user, they are not without their problems. One such problem is that given the number and different types of input mechanisms, it can be difficult for a user to manage the different input mechanisms, particularly in a mobile setting.

SUMMARY

Classifying the intent of user input techniques are described.

In one or more implementations, touch information regarding a user input to an input device is obtained. Based on this touch information, an intent of the user input is classified as being either a key strike or one or more other types of input.

In one or more implementations, an input device is configured to provide an output that indicates touch information regarding a user input. This touch information is usable by one or more modules to determine a user intent in providing the user input.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Classifying the intent of user input techniques are described. Different types of user inputs can be provided by a user via a keyboard of an input device. These different types of user inputs include, for example, key strikes, multi-touch interactions, and/or mouse clicks. Force information regarding the pressure applied to a pressure sensitive keyboard, as well as one or more locations where that pressure is applied, is used to classify the intent of the user input as one of the various types of user inputs. Contact information regarding the contact area of the user input for other types of keyboards (e.g., capacitive and/or resistive systems), as well as one or more locations where that contact area occurs, may similarly be used to classify the intent of the user input as one of the various types of user inputs.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment and Procedures

Figure 1:
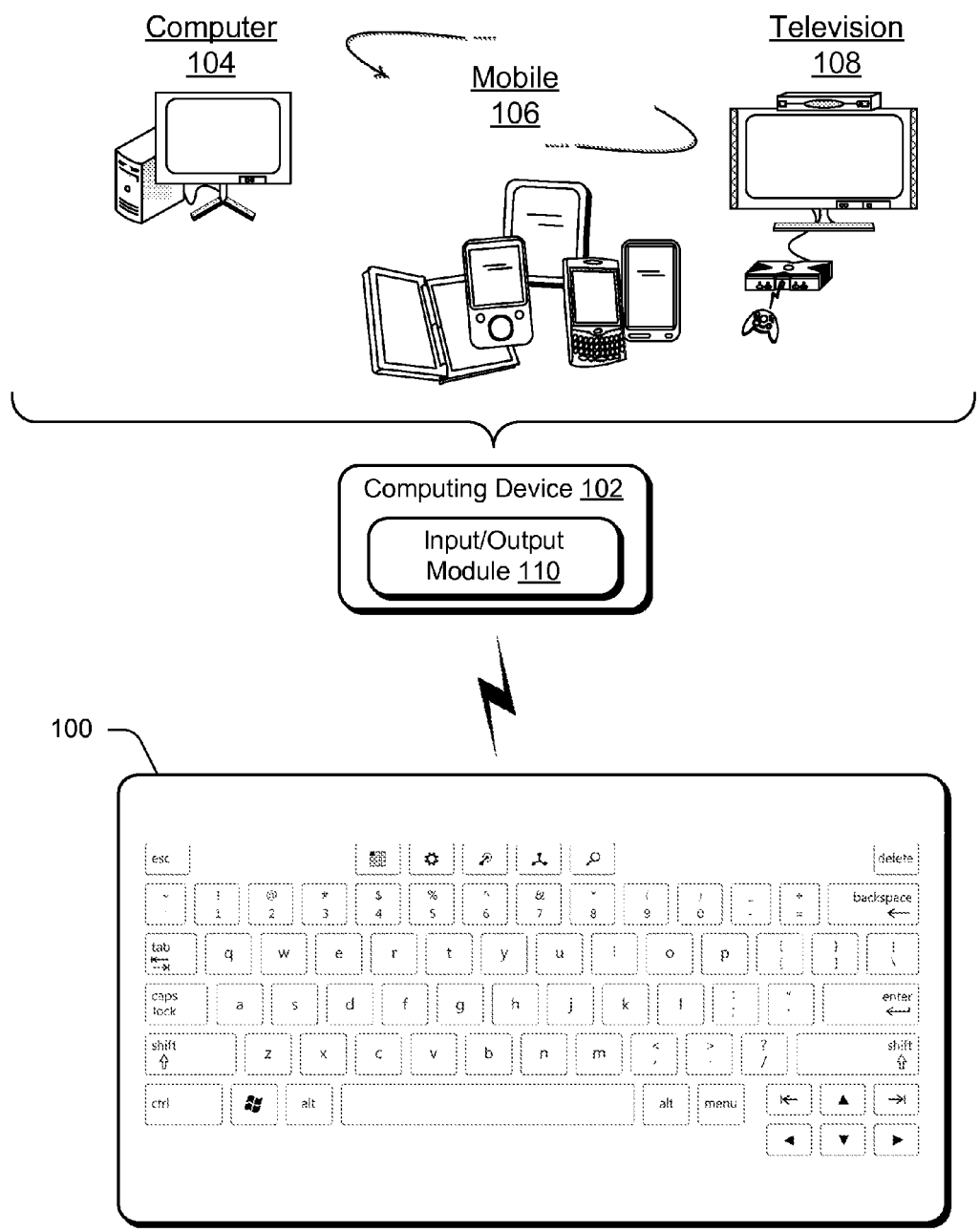
FIG. 1 is an illustration of an example input device implementing the techniques described herein.

FIG. 1 is an illustration of an example input device 100 implementing the techniques described herein. In the illustrated example, the input device 100 is configured as a keyboard having a QWERTY arrangement of keys although other arrangements of keys are also contemplated. Further, other non-conventional configurations are also contemplated, such as a game controller, a remote control device, a configuration to mimic a musical instrument, and so forth. Thus, the input device 100 and keys incorporated by the input device 100 may assume a variety of different configurations to support a variety of different functionality.

The input device 100 is a multi-use device, supporting various types of user inputs. A user input can have various different intents, such as a multi-touch interaction, a key strike, a mouse click, and so forth. The input device 100 supports these different types of user inputs in a common input area, such as the keyboard. For example, the user may touch the keys "q", "w", and "e" on the keyboard, and the intent of those touches may be determined to be key strikes selecting the letters "q", "w", and "e". The user may also swipe his or her finger across the keys "q", "w", and "e" on the keyboard, and the intent of that swipe may be determined to be a multi-touch interaction or single finger motion. This determination of the intent of the user input is discussed in more detail below.

The input device 100 may be communicatively coupled to a computing device 102. The input device 100 may be physically separate from the computing device 102 and communicate with the computing device 102 via any of a variety of conventional communication mechanisms. For example, the input device 100 may communicate with the computing device via a wireless connection, via a wired connection, via communication contacts of the devices 100 and 102 in contact with one another, and so forth.

The computing device 102 may range from full resource devices with substantial memory and processor resources to a low-resource device with limited memory and/or processing resources. The computing device 102 may also relate to software that causes the computing device 102 to perform one or more operations. In various implementations, the computing device 102 may assume a variety of different configurations, such as for computer 104, mobile 106, and television 108 uses. Each of these configurations includes devices that may have generally different constructs and capabilities, and thus the computing device 102 may be configured according to one or more of the different device classes.

For instance, the computing device 102 may be implemented as the computer 104 class of a device that includes a personal computer, desktop computer, a multi-screen computer, laptop computer, netbook, and so on. The computing device 102 may also be implemented as the mobile 106 class of device that includes mobile devices, such as a mobile phone, portable music player, portable gaming device, a tablet computer, a multi-screen computer, and so on. The computing device 102 may also be implemented as the television 108 class of device that includes devices having or connected to generally larger screens in casual viewing environments. These devices include televisions, set-top boxes, gaming consoles, and so on.

The computing device 102 also includes an input/output module 110. The input/output module 110 is representative of functionality relating to processing of inputs and rendering outputs of the computing device 102. A variety of different inputs may be processed by the input/output module 110, such as inputs relating to functions that correspond to keys of the input device 100, inputs that are multi-touch interactions or single finger motions recognized through the input device 100 and that cause operations to be performed that correspond to the multi-touch interactions or single finger motions, and so forth. Thus, the input/output module 110 may support a variety of different input techniques by recognizing and leveraging a division between types of inputs including key presses, multi-touch interactions, single finger motions, and so on.

Figure 2:
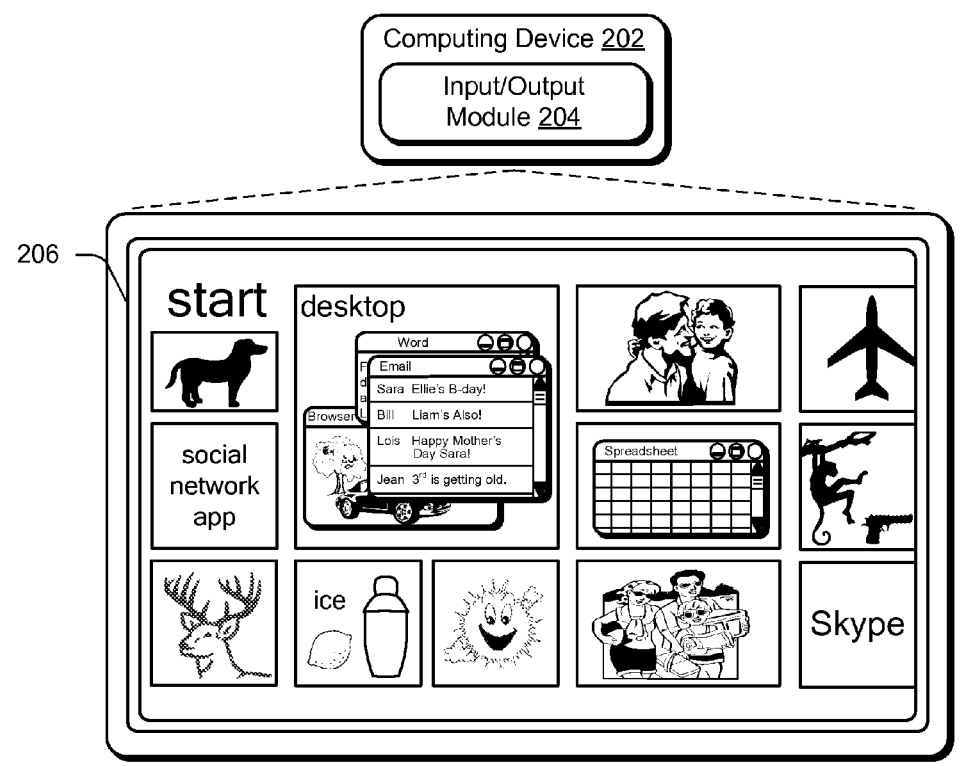
FIG. 2 is an illustration of an example computing device employing the techniques described herein.

Alternatively, the input device 100 may be included as part of a computing device. FIG. 2 is an illustration of an example computing device 202 employing the techniques described herein. The computing device 202 may assume a variety of different configurations, analogous to computing device 102 of FIG. 1. For example, the computing device 202 may be configured for mobile use, such as a mobile phone, a tablet computer, and so on. The computing device 202 may also include an input/output module 204, analogous to input/output module 110 of FIG. 1, and may also relate to software that causes the computing device 202 to perform one or more operations.

The computing device 202 includes a display device 206 via which, in a display mode, various data and information can be displayed. The display device 206 may use a variety of display technologies. These display technologies may include, for example, liquid crystal (LCD) display technologies, light-emitting diode (LED) display technologies, organic light-emitting diode (OLED) display technologies, plasma display technologies, and so forth. Although examples of display technologies are discussed herein, other display technologies are also contemplated.

Figure 3:
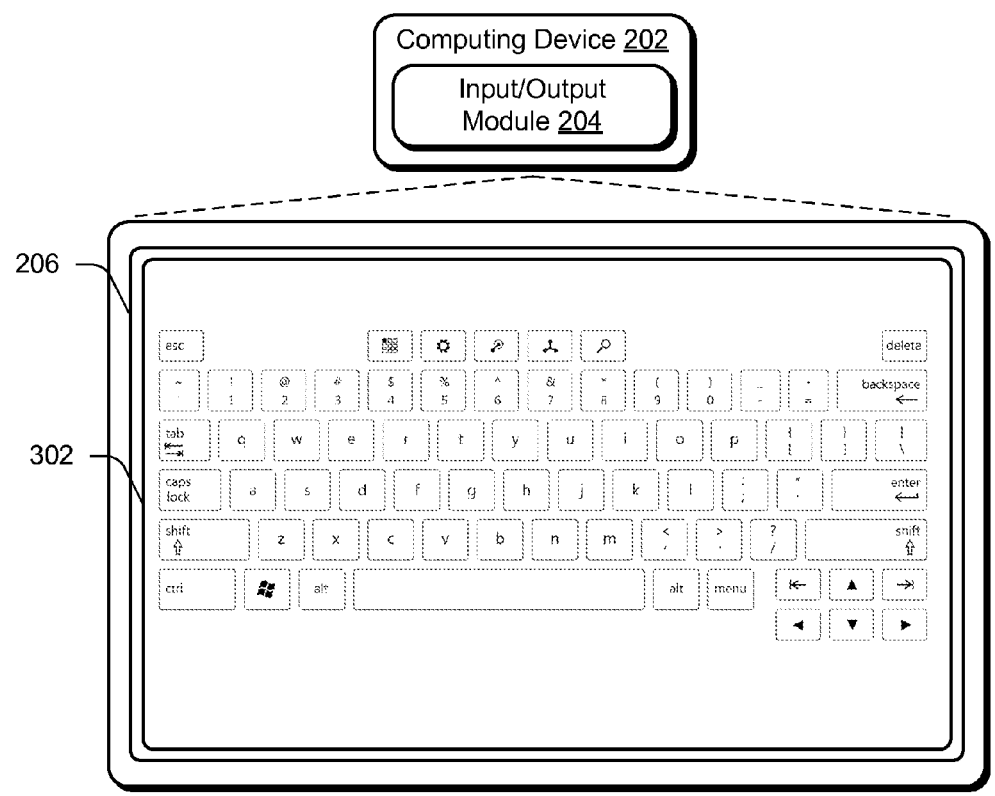
FIG. 3 is an illustration of the computing device of FIG. 2 displaying a virtual keyboard.

The display device 206 can be a touchscreen display, and various user inputs can be provided by the user touching the display device 206. The computing device 202 also supports a keyboard mode in which a virtual keyboard is displayed. FIG. 3 is an illustration of computing device 202 displaying a virtual keyboard 302. Virtual keyboard 302 is a multi-use device, supporting various types of user inputs analogous to the keyboard of input device 100 of FIG. 1. However, rather than being a physically separate device, the keyboard 302 is a virtual keyboard that is part of the computing device 202. Thus, the display device 206 also serves as the input device in computing device 202.

User inputs to the input device (e.g., the input device 100 of FIG. 1 and/or the display device 206 of FIG. 2) are sensed by an input sensing component of the input device. The input device can use a variety of different input sensing technologies. These input sensing technologies may include pressure sensitive systems that sense pressure or force. These input sensing technologies may also include capacitive systems and/or resistive systems that sense touch. These input sensing technologies may also include optical based images that sense reflection or disruption of light from objects touching (or close to) the surface of the display device, such as Sensor in Pixel (SIP) systems, Infrared systems, optical imaging systems, and so forth. Other types of input sensing technologies can also be used, such as surface acoustic wave systems, acoustic pulse recognition systems, dispersive signal systems, and so forth. Although examples of input sensing technologies are discussed herein, other input sensing technologies are also contemplated.

In response to a user touching the keyboard at a particular time, the input sensing component determines a location that was touched at that particular time. Various modules of the input sensing component may use different algorithms or techniques to identify the location that was touched, and these algorithms or techniques can vary based on the particular input sensing technology being used. For pressure sensitive input sensing components, these various modules also identify the amount of pressure applied at the location that was touched. For other types of input sensing components, these various modules also identify the area that was touched (the contact area).

The determination of a location that is touched can be determined at various frequencies, such as 1000 times per second although other sampling frequencies are contemplated. It should be noted that the frequency at which the determination of a location of a touch is made is sufficient to identify whether the user input conforms to the characteristics of different user intents. For example, a sampling frequency of 1000 times per second may be sufficient to determine whether the user inputs conform to the characteristics of a key strike intent, whereas lower sampling frequencies (such as 100 times per second) may not be sufficient to identify whether the user inputs conform to the characteristics of a key strike intent. Thus, in contrast to the input sensing components discussed herein, many input sensing components that determine a location that is touched at a low frequency would be unable to determine whether the user input conforms to the characteristics of some intents.

The input sensing component detects or senses the touch of an object, such as a finger of a user's hand, a stylus, a pen, and so forth. The discussions of the classifying the intent of user input techniques herein refer to the user input being provided by a user's finger (and thus the touch is also referred to as a finger impact), although this user input can alternatively be provided by a stylus or other object controlled by the user.

Figure 4A:
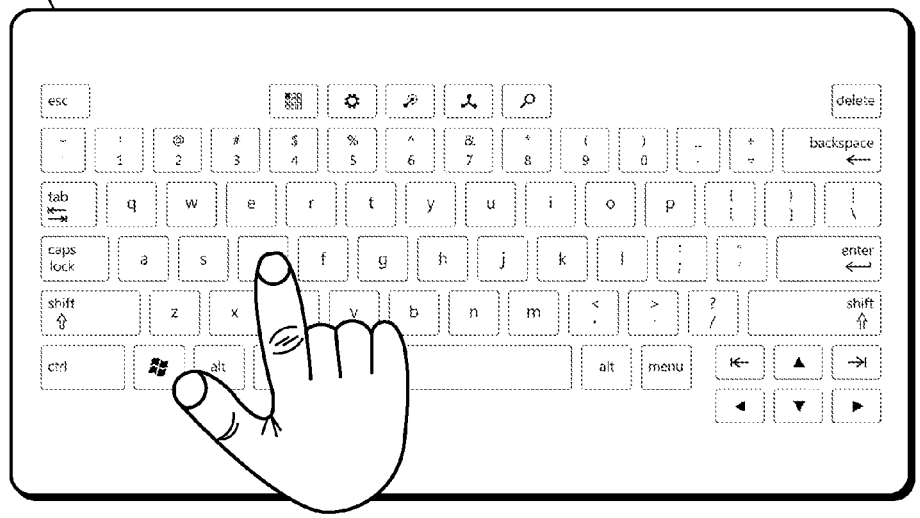
FIGS. 4A and 4B illustrate an example input device with example user inputs.
Figure 4B:
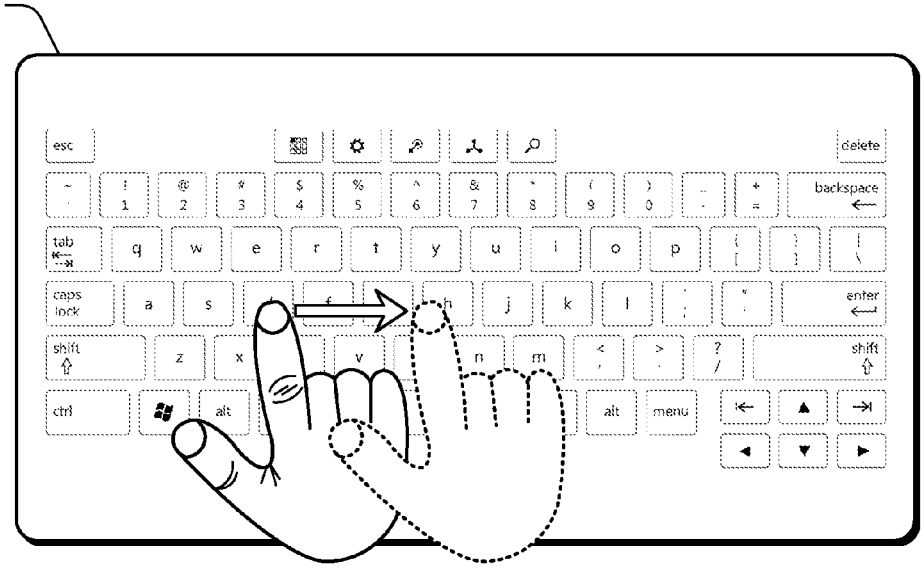

FIGS. 4A and 4B illustrate an example input device 400 with example user inputs. Input device 400 can be, for example, an input device 100 of FIG. 1 and/or a display device 206 of FIG. 3. The input device 400 is a multi-use device, supporting various types of user inputs. These multiple types of user inputs are supported concurrently. For example, the input device 400 can include a keyboard and the user can provide different types of inputs on that keyboard, with the techniques discussed herein being used to automatically determine the intent of that user input.

Thus, the touching of the input device 400 can have different user intents, such as a key strike, a mouse click, a single finger motion, or a multi-touch interaction, although other intents or types of user input are also contemplated. A key strike refers to user selection of a particular key on the keypad, with different locations of the keyboard being associated with different keys. A mouse click refers to the pressing of a button typically associated with a mouse or button of a track pad. A multi-touch interaction refers to a user touching multiple locations (e.g., with multiple ones of the user's fingers) concurrently to initiate one or functions of a computing device. The multi-touch interaction can also include a motion or path taken by one or more of the user's fingers. For example, a multi-touch interaction may be sliding of the user's fingers in one or more particular directions, the user's fingers tracing one or more particular characters or symbol, and so forth. A single finger motion refers to motion or path taken by the user's finger to move a cursor, pointer, or other object (e.g., an icon, file, etc. being dragged), or to initiate one or more functions of the computing device. A single finger motion intent and a multi-touch interaction intent can also be referred to as movement intents because they typically (although not always for multi-touch interactions) include movement by the user's finger.

FIG. 4A illustrates an example user input the intent of which is a key strike of the letter "d" or a mouse click. Whether the intent of the user input was a key strike or a mouse click can be determined in different manners, such as based on the characteristics of a key strike and the characteristics of a mouse click as discussed below.

FIG. 4B illustrates an example user input the intent of which is a single finger motion moving from left to right. The ending position of the user's finger is illustrated using a dashed outline of a hand. Whether the intent of the user input was a single finger motion can be determined in different manners, such as based on the distance the touch travels and/or a velocity of the touch, as discussed in more detail below.

As illustrated in FIGS. 4A and 4B, both user inputs begin by touching a location of the keyboard corresponding to the letter "d". However, the intent of the user (e.g., a key strike or a multi-touch interaction) can be determined using the techniques discussed herein. The user need not press any button or select any menu option to indicate his or her intent (e.g., whether the user desires to input key strikes or multi-touch interactions). Rather, the user can simply provide his or her input and the techniques discussed herein automatically determine the intent of that input.

The touch, as well as one or more locations of the touch as sensed by one or more sensors as discussed above, is used to classify the intent of a user input, such as classifying the user input as a key strike or other type of input. The user input refers to the touching by the user of one or more portions of the input device. The touch may be sensed using a dense array of pressure sensors that are sampled at a sufficient frequency to characterize the touch, as discussed above. The touch may alternatively be sensed using a capacitive sensor, with the impact being sensed indirectly by noting the rapid change in coupling as the finger conforms to the surface and then rebounds. Regardless of the type of sensors use, the location of the touch can be readily determined based on (e.g., by interpolating) data from the sensors in the region where the touch occurred.

The touch can have associated force information (in situations in which the input sensing technologies used include pressure sensitive systems) or contact information (in situations in which other input sensing technologies are used). The force information refers to the pressure applied by the user when touching the keyboard. The contact information refers to the area that is touched (the portions of the touchpad or touchscreen that were touched by the user's finger or other object, the amount of light reflected by the user's finger or other object, etc.) by the user when touching the keyboard.

In the following discussions, the classifying the intent of user input techniques are discussed with reference to force information and a user input device that is a pressure sensitive device. However, the classifying the intent of user input techniques can alternatively be implemented using other types of sensors as discussed above. In such situations, rather than using force information to classify the intent of the user input, the contact information is used to classify the intent of the user input. When using the contact information, the contact area is treated analogously to the pressure discussed below.

Figure 5:
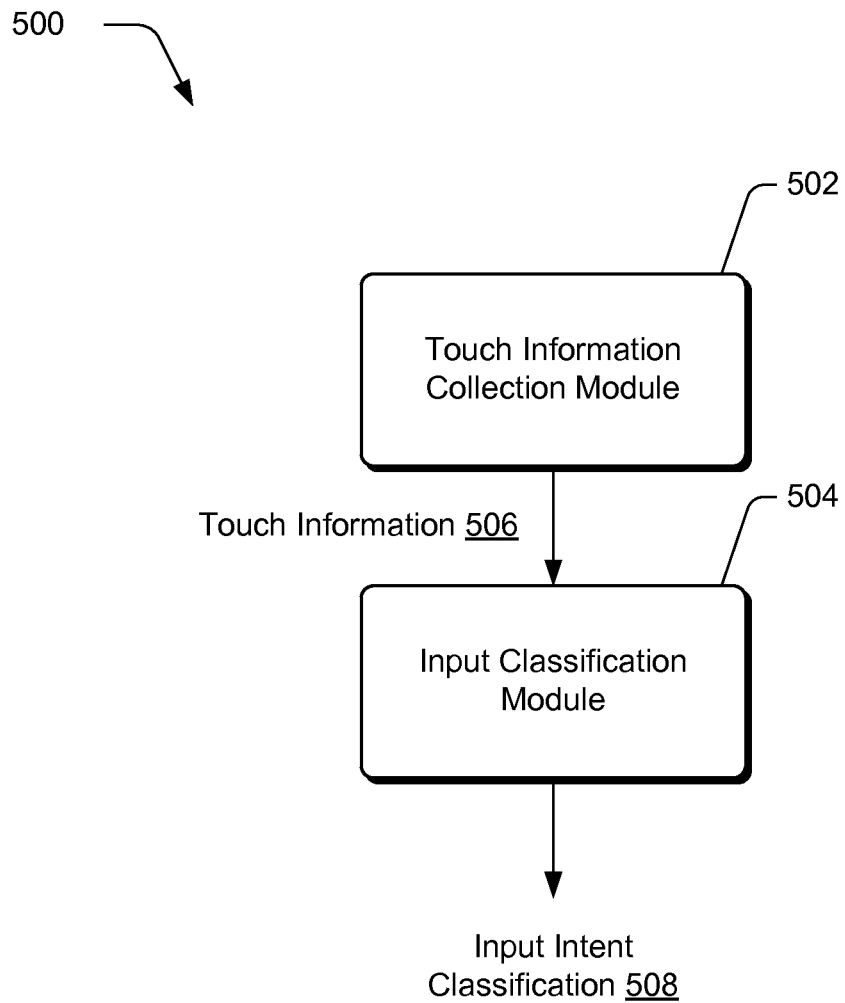
FIG. 5 is an illustration of a system in an example implementation that is operable to employ the techniques described herein.

FIG. 5 is an illustration of a system 500 in an example implementation that is operable to employ the techniques described herein. The system 500 includes a touch information collection module 502 and an input classification module 504. System 500 may be implemented, for example, in the input device 100 and/or the computing device 102 of FIG. 1, or the computing device 202 of FIGS. 2 and 3. Thus, for example, module 502 may be implemented in input device 100 and module 504 may be implemented in computing device 102, both modules 502 and 504 may be implemented in input device 100, and so forth.

Touch information collection module 502 obtains an indication of the amount of pressure applied by a user's finger over time (or alternatively contact information over time, as discussed above), as well as the locations of the touch over time, as sensed by the input sensing component as discussed above. Module 502 obtains (e.g., receives or generates) touch information 506 regarding user inputs to the keyboard of the input device. The touch information 506 identifies the characteristics of and locations of touches. These characteristics and locations of a touch can include, for example, the size of the touch (e.g., the amount of area touched), changes in the size of the touch over time, the shape of the touch (e.g., a geographic shape or outline of the area touched), changes in the shape of the touch over time, the location of the touch over time, the change in pressure of the touch over time, the movement of the touch (directions and locations that are touched), a velocity of the touch, an acceleration of the touch, a distance the touch travels, and so forth.

Based on the touch information 506, input classification module 504 classifies the intent of the user input, and outputs or otherwise makes available the input intent classification 508. Additional information, such as the touch information 506, can also be output or otherwise made available along with the input intent classification 508. The intent of the user input can be, for example, a key strike, a multi-touch interaction, a mouse click, and so forth as discussed below. The input intent classification 508 can subsequently be used by one or more other modules to take the appropriate action based on the user input. For example, if the intent is a key strike, then the key associated with the location pressed by the user as the user input is recorded as user selection of that key. By way of another example, if the intent is a multi-touch interaction, then the touch information is used to determine which multi-touch interaction was input by the user and the corresponding action taken.

Generally, the intent of the user input is classified based on the touch information 506. The force applied by the user's finger over time, and optionally the one or more locations where that force is applied, is analyzed in view of characteristics of the different intents supported by input classification module 504. A user input that conforms to the characteristics of a particular intent is classified as that particular intent, whereas a user input that does not conform to the characteristics of a particular intent is not classified as that particular intent.

In one or more embodiments, the intent of a user input can be classified as a key strike, a single finger motion, a multi-touch interaction, or other input. A user input is compared to the characteristics of one or more of a key strike, a single finger motion, a multi-touch interaction. If the user input conforms to the key strike characteristics then the intent of the user input is classified as a key strike, if the user input conforms to the single finger motion characteristics then the intent of the user input is classified as a single finger motion, and if the user input conforms to the multi-touch interaction characteristics then the intent of the user input is classified as a multi-touch interaction.

Furthermore, if the user input conforms to the characteristics of no particular intent (e.g., a key strike, a single finger motion, a multi-touch interaction, etc.), then the intent of the user input is classified as an "other" intent. The other intent refers to some other type of intent, typically an intent that is filtered out by system 500. Examples of such user inputs that can be classified as an "other" intent can be the user's hands resting on the keyboard, sensor noise, the device being bumped, and so forth. Thus, not only can input classification module 504 distinguish between different intents of user inputs to the keyboard, but module 504 can also filter out user inputs to that same keyboard that are not intended to be user inputs to the input device that are acted upon by the computing device.

A user input intent may be characterized by a force graph shape indicating the force applied by the user's finger over time for the intent. Different user input intents can have different associated force graph shapes, and input classification module 504 can maintain these different force graph shapes and compare user inputs to these different force graph shapes. A user input (as characterized by touch information 506) that conforms to the force graph shape for an intent is classified as being that particular intent. Whether a user input conforms to a particular force graph shape can be determined in a variety of different manners. For example, a force graph can be generated based on the touch information obtained for the user input, and the generated force graph can be compared to the one or more maintained force graph shapes. If the generated force graph shape matches a particular maintained force graph shape, then the user input conforms to the intent associated with that particular maintained force graph shape. Whether two graph shapes match can be determined using a variety of public and/or proprietary graph or shape matching techniques.

The behavior of a particular touching of the keyboard over a lifetime of the touch may be used to classify a user input as a key strike or other type of input (e.g., a multi-touch interaction or single finger motion). The lifetime of the touch refers to a time duration that begins when the user's finger touching the surface is sensed and ends when the user's finger is no longer sensed as touching the surface. The user's finger can remain approximately stationary for the lifetime of the touch (e.g., which may be typical for a key strike), or can move across the keypad during the lifetime of the touch (e.g., which may be typical for multi-touch interactions and single finger motions).

The intent of a user input may be classified as a movement in response to the touch travelling at least a threshold distance. This threshold distance can be a fixed distance (e.g., 1.5 inches) or a relative distance (e.g., 10% of the width of the keyboard). The travelling of a touch refers to the distance moved by the user's finger while being moved along some path during the lifetime of the touch. If multiple touches are sensed concurrently then the intent of the user input may be classified as a multi-touch interaction, whereas if only a single touch is sensed at a particular time then the intent of the user input at that particular time may be classified as a single finger motion.

The intent of a user input may also be classified as a movement in response to the touch having at least a threshold velocity and a short (e.g., less than a threshold value) lifetime. The threshold value of the lifetime of the touch may be 0.25 seconds, although other threshold values are contemplated. The velocity of a touch refers to the distance moved by the user's finger while being moved along some path during the lifetime of the touch divided by the time duration of the lifetime of the touch. For example, the velocity may be 4 inches/second, although other velocities are contemplated. If multiple touches are sensed concurrently then the intent of the user input may be classified as a multi-touch interaction, whereas if only a single touch is sensed at a particular time then the intent of the user input at that particular time may be classified as a single finger motion.

Generally, a key strike (also referred to as a tap) is characterized by a sharp rise in force followed by a sharp decrease in force as the finger rebounds from the surface, and optionally followed by a rise in force again as the momentum of the remainder of the finger continues towards the surface of the keyboard. The pressure of a touch is analyzed over time, and based on these characteristics of a key strike the user input is classified as either a key strike or some other type of input (e.g., a multi-touch interaction). User inputs that conform to these characteristics are classified as key strikes, and user inputs that do not conform to these characteristics are classified as other types of user inputs. If the user inputs include multiple touches concurrently, then the user input may be classified as multiple key strikes if each touch conforms to the characteristics of a key strike and the touches are for particular locations (e.g., locations corresponding to a modifier key on the keyboard, such as a "shift" key, a "ctrl" key, an "alt" key, and so forth). Alternatively, if the user inputs include multiple touches concurrently, then the user input is classified as some other type of input rather than a key strike.

It should be noted that these characteristics of a key strike allow the intent of a user input to be distinguished between a key strike and an "other" intent (e.g., the user resting his or her hands on the keyboard). The key strike is characterized by a particular force graph shape indicating the force applied by the user's finger over time. If a user intends to strike a key then the input conforms to this particular force graph shape, and if the user intends to rest his or her hands on the keyboard then the input does not conform to this particular force graph shape. Thus a key strike intent or an "other" intent can be readily determined based on whether the user input conforms to this particular force graph shape.

The characteristics of a key strike can also include temporal information. For example, the characteristics of a key strike may include the touch being at the same location (not moving) or having a location that moves less than a threshold amount (e.g., less than the width or height of a key on the keyboard, although other threshold amounts are contemplated).

Figure 6:
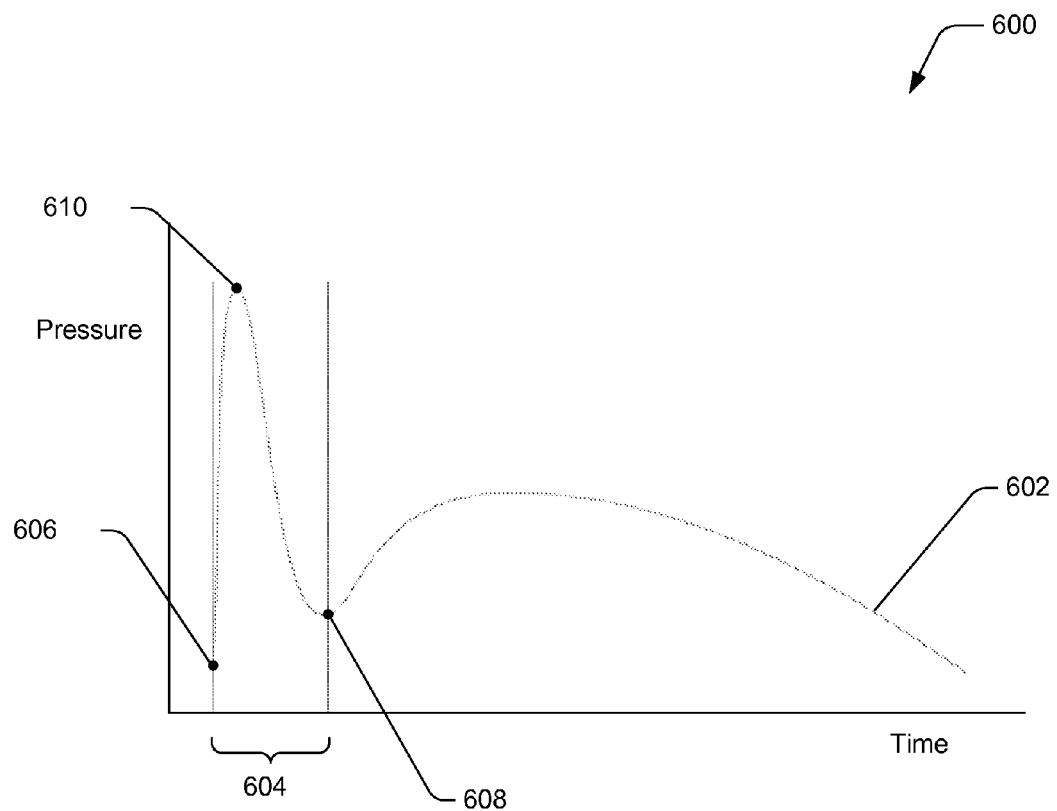
FIG. 6 depicts an example of a graph of pressure at a particular location over time.

FIG. 6 depicts an example 600 of a graph of pressure of a touch over time. The vertical axis is pressure or force (e.g., in grams), and the horizontal axis is time (e.g., in milliseconds). A line 602 represents the pressure applied as the touch over time. The pressure applied as the touch over time can be analyzed to determine whether the pressure applied conforms to the characteristics of a key strike.

In analyzing the pressure an initial impact time duration may be determined, which is a duration of time that begins when the pressure applied as the touch rises to (e.g., is equal to or greater than) a start threshold amount. This start threshold amount may be 200 grams, although other start threshold amounts are contemplated. This duration of time ends when the pressure applied as the touch reaches a local minimum before rising again (e.g., as the momentum of the remainder of the finger continues towards the surface of the keyboard) or the pressure applied as the touch drops to (e.g., is equal to or less than) a stop threshold amount. This stop threshold amount may be the same as the start threshold amount (e.g., 200 grams) or a lesser amount (e.g., 100 grams), although other values for the stop threshold amount are contemplated. Thus, the initial impact time duration can be different for different user inputs.

In example 600, an initial impact time duration 604 is illustrated. The initial impact time duration begins at point 606 where the pressure applied as the touch rises to the start threshold amount, and ends at point 608 where the pressure applied as the touch drops to a local minimum before rising again.

Also in analyzing the pressure a maximum force may be identified. This maximum force refers to a local maximum of the pressure applied as the touch during the initial impact time duration 604 and after the pressure applied as the touch rises to the start threshold amount. In example 600, the maximum force is at point 610.

Given the initial impact time duration and/or the maximum force, various rules or criteria are applied to determine whether the pressure applied conforms to the characteristics of a key strike. These rules or criteria may include an initial impact criteria, a maximum force criteria, and/or an initial impact ending force criteria.

The initial impact criteria refers to the duration of the initial impact time duration, indicating that the initial impact time duration is to be within a particular time range. This particular time range can be, for example, between 5 milliseconds (ms) and 25 ms, although other time ranges are contemplated. Thus, for example, the initial impact time duration is to be at least 5 ms and no more than 25 ms in order for the pressure applied as the touch to conform to the characteristics of a key strike.

The maximum force criteria refers to when, within the initial impact time duration, the maximum force occurs. The maximum force criteria indicates that the maximum force is to occur within a threshold amount of time, such as 12 ms although other amounts of time are also contemplated. The maximum force criteria also indicates that the maximum force is not to occur in a last portion of the initial impact time duration. This last portion may be the last third of the initial impact time duration, although other portions are contemplated. Thus, for example, the maximum force is to occur within the first 12 ms of the initial impact time duration and is not to occur within the last ⅓ of the initial impact time duration in order for the pressure applied as the touch to conform to the characteristics of a key strike.

The initial impact ending force criteria refers to the pressure of the touch at the end of the initial impact time duration. The initial impact ending force criteria indicates that the pressure of the touch at the end of the initial impact time duration is to be less than a particular percentage of the maximum force. This particular percentage may be 80%, although other percentages are contemplated. Alternatively, the initial impact ending force criteria can indicate that the pressure of the touch is to be less than another particular percentage of the maximum force in response to the maximum force being reached quickly (within a threshold amount of time). This other particular percentage may be 90% and the threshold amount of time may be 5 ms, although other percentages and threshold amounts of time are contemplated. Thus, for example, at the end of the initial impact time duration the pressure of the touch is to be less than 80% of the maximum force, or less than 90% of the maximum force if the maximum force was reached within 5 ms, in order for the pressure applied as the touch to conform to the characteristics of a key strike.

If the initial impact criteria, the maximum force criteria, and the initial impact ending force criteria all conform to the characteristics of a key strike, then the pressure applied as the touch conforms to the characteristics of a key strike and the user input is classified as a key strike. However, if one or more of the initial impact criteria, the maximum force criteria, and the initial impact ending force criteria does not conform to the characteristics of a key strike, then the pressure applied as the touch does not conform to the characteristics of a key strike and the user input is not classified as a key strike.

Characteristics of a key strike are discussed above. Characteristics of other types of inputs can also be maintained. The pressure of a touch may be analyzed over time and a determination made as to whether the user input conforms to the characteristics of another type of input. User inputs that conform to the characteristics of another type of input are classified as that other type of input, while user inputs that do not conform to the characteristics of that other type input are not classified as that other type of input.

For example, a mouse click may be characterized by a slow rise in force followed by a sharp decrease in force as the finger rebounds from the surface. The pressure of a touch is analyzed over time, and based on these characteristics of a mouse click the user input is classified as either a mouse click or some other type of input (e.g., a key strike). User inputs that conform to these characteristics are classified as mouse clicks, and user inputs that do not conform to these characteristics are classified as other types of user inputs.

The characteristics of a mouse click can also include temporal information. For example, the characteristics of a mouse click may include the touch being at the same location (not moving) or having a location that moves less than a threshold amount (e.g., 0.25 inches, although other threshold amounts are contemplated).

Figure 7:
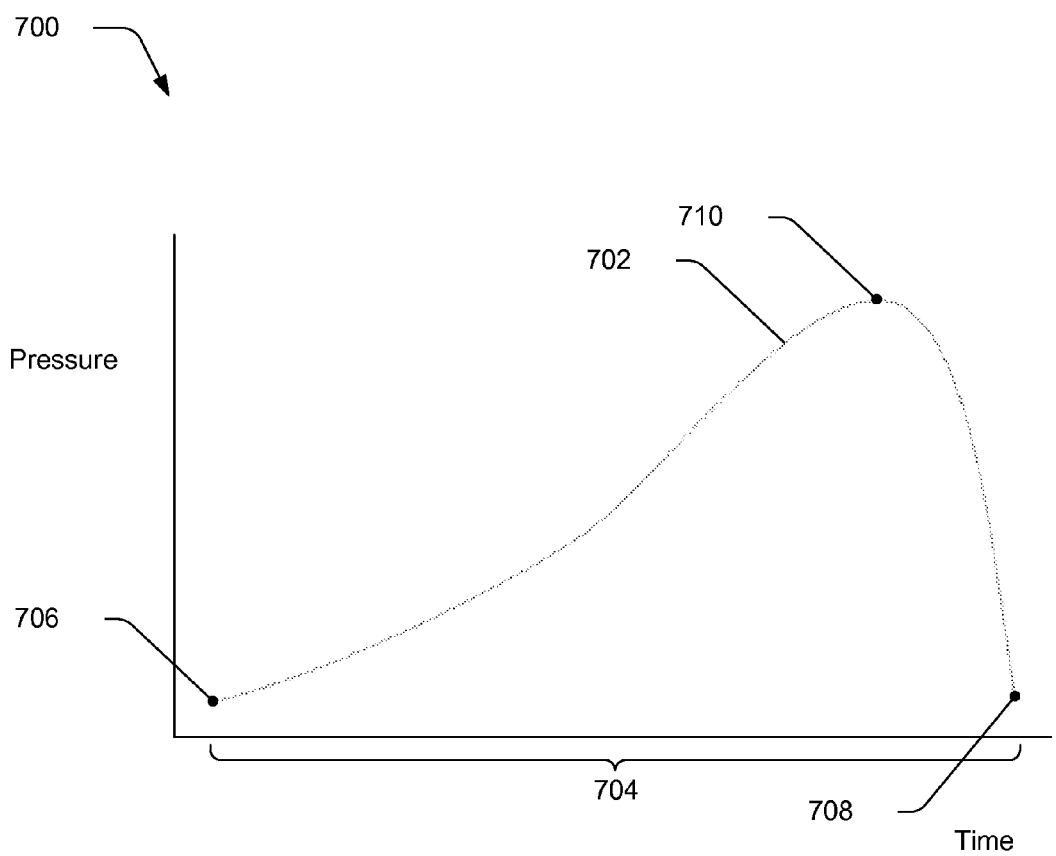
FIG. 7 depicts another example of a graph of pressure at a particular location over time.

FIG. 7 depicts an example 700 of a graph of pressure of a touch over time. The vertical axis is pressure or force (e.g., in grams), and the horizontal axis is time (e.g., in milliseconds). A line 702 represents the pressure applied as the touch over time. The pressure applied as the touch over time can be analyzed to determine whether the pressure applied conforms to the characteristics of a mouse click.

In analyzing the pressure a touch time duration may be determined, which is a duration of time that begins when the pressure applied as the touch rises to (e.g., is equal to or greater than) a start threshold amount. This start threshold amount may be 200 grams, although other start threshold amounts are contemplated. This duration of time ends when the pressure applied as the touch drops to (e.g., is equal to or less than) a stop threshold amount. This stop threshold amount may be the same as the start threshold amount (e.g., 200 grams) or a lesser amount (e.g., 100 grams), although other values for the stop threshold amount are contemplated.

In example 700, a touch time duration 704 is illustrated. The touch time duration begins at point 706 where the pressure applied as the touch rises to the start threshold amount, and ends at point 708 where the pressure applied as the touch drops to the stop threshold amount.

Also in analyzing the pressure a maximum force may be identified. This maximum force refers to a local maximum of the pressure applied as the touch during the touch time duration 704 and after the pressure applied as the touch rises to the start threshold amount. In example 700, the maximum force is at point 710.

Given the touch time duration and/or the maximum force, various rules or criteria are applied to determine whether the pressure applied conforms to the characteristics of a mouse click. These rules or criteria may include rules or criteria referring to when the maximum force occurs. The rules or criteria may indicate that the maximum force is to occur at least a threshold amount of time (e.g., 25 ms, although other amounts of time are also contemplated) after the pressure applied as the touch rises to the start threshold amount. The rules or criteria may indicate that the maximum force is not to occur in a beginning portion of the touch time duration. This beginning portion may be the beginning half of the touch time duration, although other portions are contemplated. Thus, for example, the rules or criteria may indicate that the maximum force is to occur at least 25 ms after the touch time duration beginning, and is not to occur within the first half of the touch time duration in order for the pressure applied as the touch to correspond to the characteristics of a mouse click.

As indicated above, although discussed herein with reference to force information and a user input device that is a pressure sensitive input device, the classifying the intent of user input techniques can alternatively be implemented using other types of sensors and input sensing technologies. In such situations, rather than using the pressure applied by a user input to classify the intent of the user input, the contact area of the user input (the portions of the touchpad or touchscreen that were touched by the user's finger or other object, the amount of light reflected by the user's finger or other object, etc.) may be used to classify the intent of a user input. The contact area (e.g., measured in millimeters or other units) is treated analogously to the pressure discussed above. For example, referring to FIG. 5, a key strike is characterized by a sharp rise in contact area followed by a sharp decrease in contact area as the finger or other object touching the surface rebounds from the surface, and optionally followed by a rise in contact area again as the momentum of the remainder of the finger or other object touching the surface of the keyboard continues towards the surface.

Figure 8:
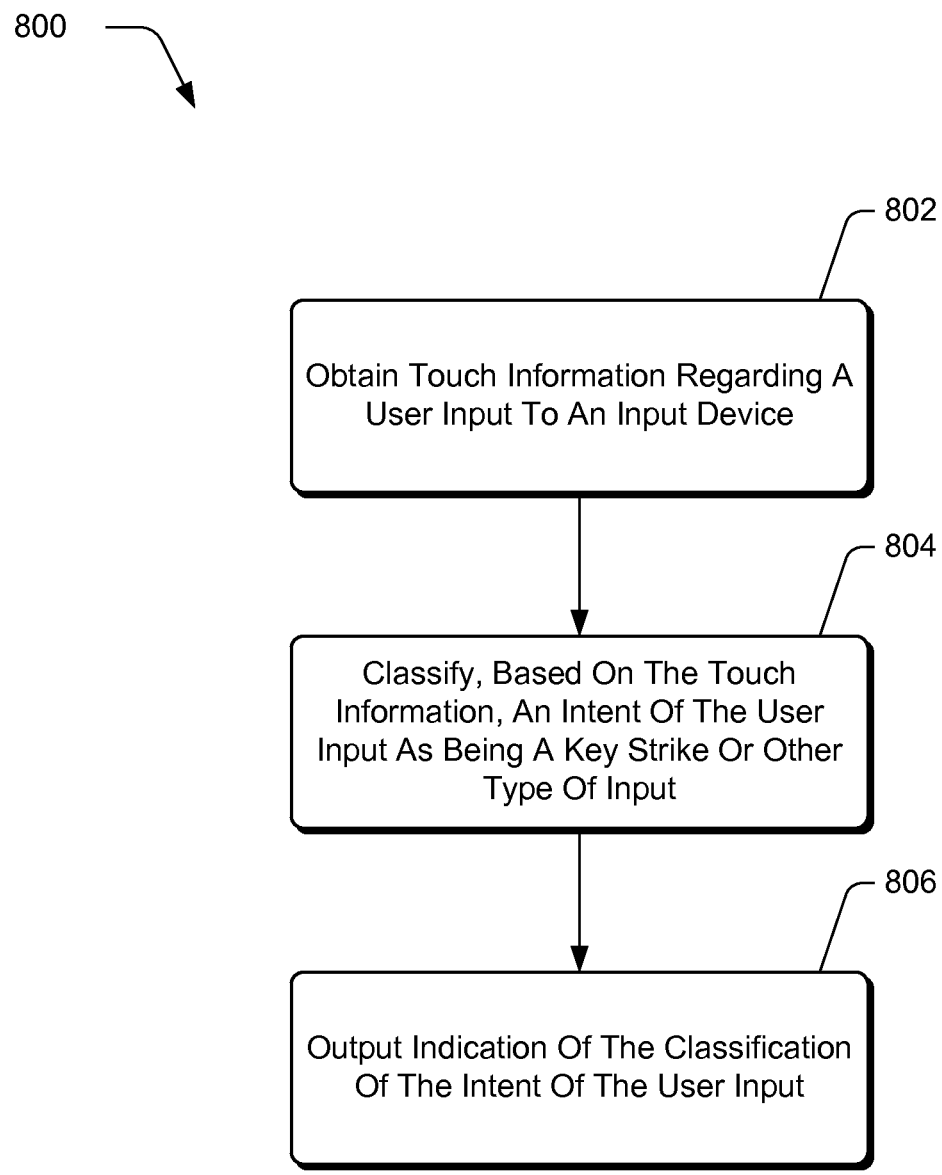
FIG. 8 is a flowchart illustrating an example process for implementing the techniques described herein in accordance with one or more embodiments.

FIG. 8 is a flowchart illustrating an example process 800 for implementing the techniques described herein in accordance with one or more embodiments. Process 800 is carried out by an input classification module, such as input classification module 504 of FIG. 5, and can be implemented in software, firmware, hardware, or combinations thereof. Process 800 is shown as a set of acts and is not limited to the order shown for performing the operations of the various acts. Process 800 is an example process for implementing the techniques described herein; additional discussions of implementing the techniques described herein are included herein with reference to different figures.

In process 800, touch information regarding a user input to an input device is obtained (act 802). This touch information can be obtained from a pressure sensitive input device, or other types of input devices (e.g., capacitive or resistive) as discussed above.

Based on the obtained touch information, an intent of the user input is classified as being a key strike or other type of input (act 804). The classification is performed based on characteristics of a key strike or other type of input, as discussed above. Various other types of inputs can be received as user inputs, such as multi-touch interactions, a single finger motions, and mouse clicks as discussed above.

An indication of the classification of the user input is output (act 806). This classification can be used by one or more other modules (e.g., of computing device 102 of FIG. 1) to take the appropriate action based on the user input. This classification can be output to, for example, one or more modules of the input device 104 and/or the computing device 102 of FIG. 1.

Figure 9:
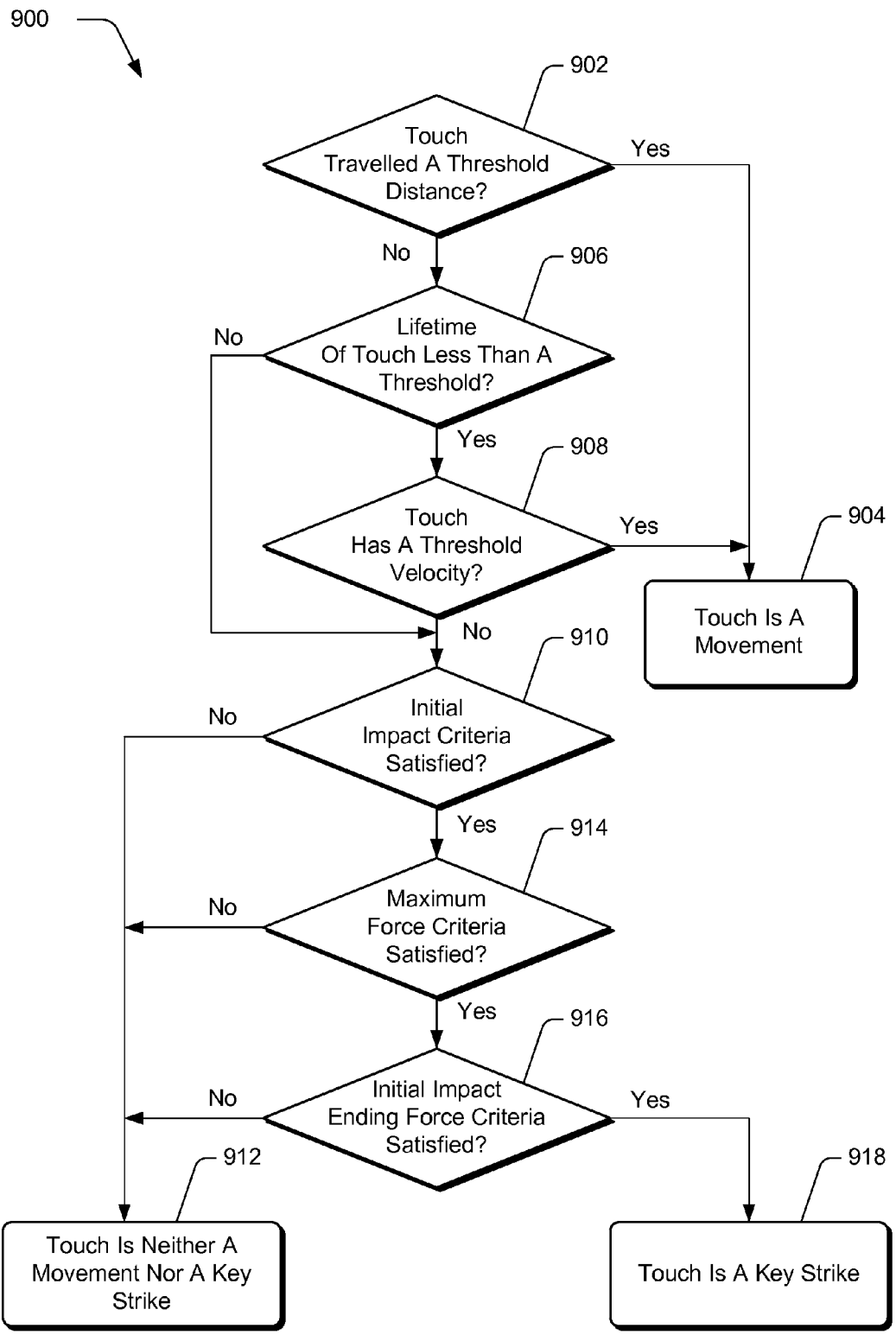
FIG. 9 is a flowchart illustrating another example process for implementing the techniques described herein in accordance with one or more embodiments.

FIG. 9 is a flowchart illustrating another example process 900 for implementing the techniques described herein in accordance with one or more embodiments. Process 900 is carried out by an input classification module, such as input classification module 504 of FIG. 5, and can be implemented in software, firmware, hardware, or combinations thereof. Process 900 is shown as a set of acts and is not limited to the order shown for performing the operations of the various acts. Process 900 is an example process for implementing the techniques described herein; additional discussions of implementing the techniques described herein are included herein with reference to different figures.

In process 900, when a user input is received (e.g., the user touches the keyboard), a check is made as to whether the touch travels a threshold distance (act 902). This threshold distance can be a fixed or relative distance, such as 1.5 inches or 10% of the width of the keyboard, as discussed above.

If the touch travels a threshold distance (e.g., at least the threshold distance, equal to or greater than the threshold distance, etc.), then the touch is classified as a movement (act 904). A movement can be, for example, a single finger motion or a multi-touch interaction, as discussed above. Whether the movement is a single finger motion or a multi-touch interaction can be determined in different manners. For example, if during the time of the touch multiple touches (e.g., multiple fingers) are sensed concurrently then the movement is a multi-touch interaction, whereas if during the time of the touch just a single touch (e.g., a single finger) is sensed then the movement is a single finger motion. By way of another example, if the input device does not support (or is operating in a mode that does not support) multi-touch interactions, then the movement is a single finger motion. By way of another example, if the input device does not support (or is operating in a mode that does not support) single finger motions, then the movement is a multi-touch interaction.

However, if the touch does not travel the threshold distance, then a check is made as to whether the lifetime of the touch is less than a threshold amount (act 906). If the lifetime of the touch is less than a threshold amount (e.g., less than 0.25 seconds), then a check is made as to whether the touch has a threshold velocity (act 908). This threshold velocity can be, for example, 4 inches/second or other velocities as discussed above. If the touch has a threshold velocity (e.g., at least the threshold velocity, equal to or greater than the threshold velocity, etc.), then the touch is classified as a movement (act 904). A movement can be, for example, a single finger motion or a multi-touch interaction, as discussed above.

However, if the lifetime of the touch is not less than the threshold amount, or if the touch does not have the threshold velocity, then a check is made as to whether initial impact criteria are satisfied (act 910). The initial impact criteria are satisfied if the initial impact time duration is within a particular time range (e.g., at least 5 ms and no more than 25 ms), as discussed above.

If the initial impact criteria are not satisfied, then the touch is classified as neither a movement nor a key strike (act 912). In such situations, the touch may be interpreted as some default input (e.g., the user resting his or her fingers on the keyboard), or alternatively may be further analyzed to determine the intent of the user input (e.g., a mouse click, as discussed above).

However, if the initial impact criteria are satisfied, then a check is made as to whether maximum force criteria are satisfied (act 914). The maximum force criteria are satisfied if the maximum force occurs during a particular portion of the initial impact time duration (e.g., within the first 12 ms of the initial impact time duration, or during the first ⅔ of the initial impact time duration), as discussed above.

If the maximum force criteria are not satisfied, then the touch is classified as neither a movement nor a key strike (act 912).

However, if the maximum force criteria are satisfied, then a check is made as to whether initial impact ending force criteria are satisfied (act 916). The initial impact ending force criteria are satisfied if the pressure on the key at the end of the initial impact time duration is less than a particular percentage of the maximum force (e.g., less than 80% of the maximum force, or less than 90% of the maximum force if the maximum force occurred in the first 5 ms of the initial impact time duration), as discussed above.

If the initial impact ending force criteria are not satisfied, then the touch is classified as neither a movement nor a key strike (act 912). However, if the initial impact ending force criteria are satisfied, then the touch is classified as a key strike (act 918).

Example System and Device

Figure 10:
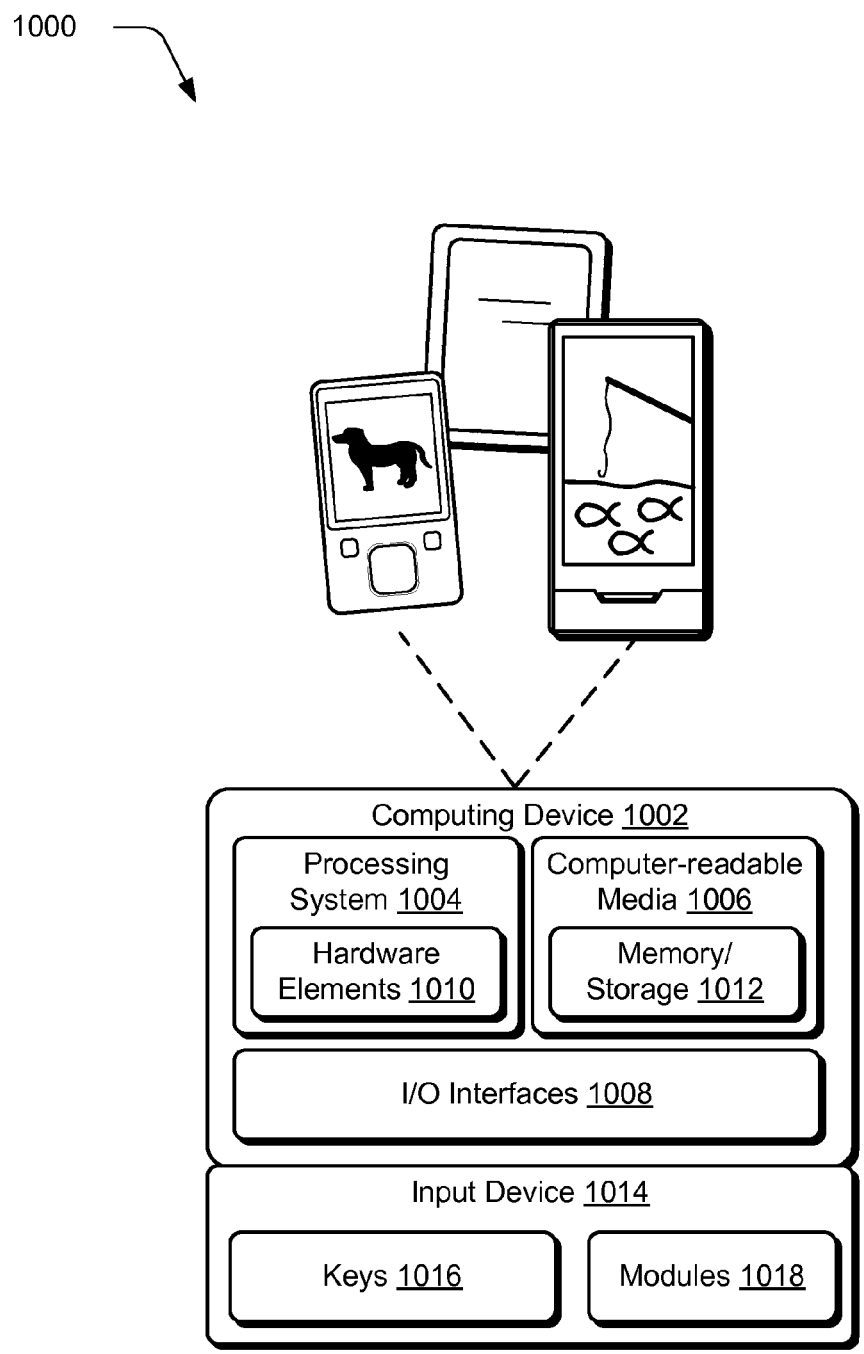
FIG. 10 illustrates an example system including various components of an example device that can be implemented as any type of computing device as described with reference to FIGS. 1-9 to implement embodiments of the techniques described herein.

FIG. 10 illustrates an example system generally at 1000 that includes an example computing device 1002 that is representative of one or more computing systems and/or devices that may implement the various techniques described herein. The computing device 1002 may, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1002 as illustrated includes a processing system 1004, one or more computer-readable media 1006, and one or more I/O interfaces 1008 that are communicatively coupled, one to another. Although not shown, the computing device 1002 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1004 is representative of functionality to perform one or more operations using hardware. Accordingly, the processing system 1004 is illustrated as including hardware elements 1010 that may be configured as processors, functional blocks, and so forth. This may include implementation in hardware as an application specific integrated circuit or other logic device formed using one or more semiconductors. The hardware elements 1010 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1006 is illustrated as including memory/storage 1012. The memory/storage 1012 represents memory/storage capacity associated with one or more computer-readable media. The memory/storage component 1012 may include volatile media (such as random access memory (RAM)) and/or nonvolatile media (such as read only memory (ROM), Flash memory, optical disks, magnetic disks, and so forth). The memory/storage component 1012 may include fixed media (e.g., RAM, ROM, a fixed hard drive, and so on) as well as removable media (e.g., Flash memory, a removable hard drive, an optical disc, and so forth). The computer-readable media 1006 may be configured in a variety of other ways as further described below.

Input/output interface(s) 1008 are representative of functionality to allow a user to enter commands and information to computing device 1002, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1002 may be configured in a variety of ways to support user interaction.

The computing device 1002 is further illustrated as being communicatively and physically coupled to an input device 1014 that is physically and communicatively removable from the computing device 1002. In this way, a variety of different input devices may be coupled to the computing device 1002 having a wide variety of configurations to support a wide variety of functionality. In this example, the input device 1014 includes one or more keys 1016, which may be configured as pressure sensitive keys, keys on a touchpad or touchscreen, mechanically switched keys, and so forth.

The input device 1014 is further illustrated as including one or more modules 1018 that may be configured to support a variety of functionality. The one or more modules 1018, for instance, may be configured to process analog and/or digital signals received from the keys 1016 to determine whether a keystroke was intended, determine whether an input is indicative of resting pressure, support authentication of the input device 1014 for operation with the computing device 1002, classify the intent of user input, and so on. Modules 1018 may include, for example, the input classification module 504 of FIG. 5.

Although illustrated as separate from the computing device 1002, the input device 1014 can alternatively be included as part of the computing device 1002 as discussed above. In such situations, the keys 1016 and the modules 1018 are included as part of the computing device 1002. Additionally, in such situations the keys 1016 may be keys of a virtual keyboard and/or keys of a non-virtual keyboard (e.g., a pressure sensitive input device).

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1002. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1002, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1010 and computer-readable media 1006 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1010. The computing device 1002 may be configured to implement particular instructions and/or functions corresponding to the software and/or hardware modules. Accordingly, implementation of a module that is executable by the computing device 1002 as software may be achieved at least partially in hardware, e.g., through use of computer-readable storage media and/or hardware elements 1010 of the processing system 1004. The instructions and/or functions may be executable/operable by one or more articles of manufacture (for example, one or more computing devices 1002 and/or processing systems 1004) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:
1. A method comprising:
obtaining force information regarding a particular single touch user input to a common input area of an input device, the force information indicating pressure applied by the particular single touch user input;
analyzing the force information to classify an intent of the particular single touch user input as one of two intents, the two intents comprising a key strike and a mouse click, the analyzing including defining an initial impact time duration beginning when pressure applied as the particular single touch user input rises to a start threshold amount, and ending when the pressure applied as the particular single touch user input drops to a local minimum or a stop threshold amount;
classifying the intent of the particular single touch user input as a key strike in response to the particular single touch user input comprising a sharp rise in force fol- lowed by a sharp decrease in force, the sharp rise and the sharp decrease in force occurring during the initial impact time duration; and classifying the intent of the particular single touch user input as a mouse click in response to the force information conforming to characteristics of a mouse click.

2. A method as recited in claim 1, the input device comprising multiple pressure sensors that receive the particular single touch user input, and the obtaining comprising obtaining force information from the multiple pressure sensors.

3. A method as recited in claim 1, the input device comprising an input device that is physically separate from and communicatively removable from a computing device.

4. A method as recited in claim 1, the analyzing comprising analyzing the force information to automatically classify the intent of the user in the absence of another option or button selection by the user to indicate the intent of the user.

5. A method as recited in claim 1, the classifying the intent of the particular single touch user input as a key strike comprising classifying the intent of the particular single touch user input as a key strike only if the initial impact time duration is within a particular time range.

6. A method as recited in claim 1, the analyzing including defining an additional time duration beginning when pressure applied as the particular single touch user input rises to the start threshold amount, and ending when the pressure applied as the particular single touch user input drops to an additional stop threshold amount, and identifying a maximum force applied as the particular single touch user input during the additional time duration, and the classifying the intent of the particular single touch user input as a mouse click comprising classifying the intent of the particular single touch user input as a mouse click only if the maximum force applied as the particular single touch user input during the additional time duration is applied at least a threshold amount of time after the beginning of the additional time duration.

7. A method as recited in claim 1, the pressure applied as the particular single touch user input rising to a local maximum force during the initial impact time duration, and the sharp rise in force followed by the sharp decrease in force comprising the pressure applied as the particular single touch user input rising to the local maximum force within a threshold amount of time of the beginning of the initial impact time duration, and the pressure applied as the particular single touch user input at the ending of the initial impact time duration being less than a particular percentage of the local maximum force.

8. A method implemented in a pressure sensitive keyboard input device, the method comprising:

obtaining, at the pressure sensitive keyboard input device, force information regarding a particular single touch user input to the pressure sensitive keyboard input device, the force information identifying pressure applied by the particular single touch user input over time; and automatically distinguishing, based on the force information, between two possible intents of the particular single touch user input, the two possible intents of the particular single touch user input being a key strike and a mouse click, the automatically distinguishing including:

defining an initial impact time duration beginning when pressure applied as the particular single touch user input rises to a start threshold amount, and ending when the pressure applied as the particular single touch user input drops to a local minimum or a stop threshold amount, the pressure applied as the particular single touch user input rising to a local maximum force during the initial impact time duration, and classifying the intent of the particular single touch user input as a key strike in response to both the pressure applied as the particular single touch user input rising to the local maximum within a threshold amount of time of the beginning of the initial impact time duration, and the pressure applied as the particular single touch user input at the ending of the initial impact time duration being less than a particular percentage of the local maximum force.

9. A method as recited in claim 8, the pressure sensitive keyboard input device comprising an input device that is physically separate from and communicatively removable from a computing device.

10. A method as recited in claim 8, the automatically distinguishing comprising automatically distinguishing between the two possible intents of the particular single touch user input in the absence of another option or button selection by the user to indicate the intent of the user.

11. A method as recited in claim 8, the classifying the intent of the particular single touch user input as a key strike further comprising classifying the intent of the particular single touch user input as a key strike only if the initial impact time duration is within a particular time range.

12. A method as recited in claim 8, the automatically distinguishing further including:

defining an additional time duration beginning when pressure applied as the particular single touch user input rises to the start threshold amount, and ending when the pressure applied as the particular single touch user input drops to an additional stop threshold amount;

identifying a maximum force applied as the particular single touch user input during the additional time duration; and classifying the intent of the particular single touch user input as a mouse click in response to the maximum force applied as the particular single touch user input during the additional time duration being applied at least a threshold amount of time after the beginning of the additional time duration.

13. An apparatus comprising:

an input device configured to obtain force information regarding a particular single touch user input to a common input area of the input device, the force information indicating pressure applied by the particular single touch user input; and one or more modules implementing operations including:

analyzing the force information to classify an intent of the particular single touch user input as one of two intents, the two intents comprising a key strike and a mouse click, the analyzing including defining an initial impact time duration beginning when pressure applied as the particular single touch user input rises to a start threshold amount, and ending when the pressure applied as the particular single touch user input drops to a local minimum or a stop threshold amount, classifying the intent of the particular single touch user input as a key strike in response to the particular single touch user input comprising a sharp rise in force followed by a sharp decrease in force, the sharp rise and the sharp decrease in force occurring during the initial impact time duration, and classifying the intent of the particular single touch user input as a mouse click in response to the force information conforming to characteristics of a mouse click.

14. An apparatus as recited in claim 13, the pressure applied as the particular single touch user input rising to a local maximum force during the initial impact time duration, and the sharp rise in force followed by the sharp decrease in force comprising the pressure applied as the particular single touch user input rising to the local maximum force within a threshold amount of time of the beginning of the initial impact time duration, and the pressure applied as the particular single touch user input at the ending of the initial impact time duration being less than a particular percentage of the local maximum force.

15. An apparatus as recited in claim 14, the particular percentage of the local maximum force varying based on whether the local maximum force occurred within an additional threshold amount of time of the beginning of the initial impact time duration.

16. An apparatus as recited in claim 13, the input device comprising multiple pressure sensors that receive the particular single touch user input and that are configured to obtain the force information.

17. An apparatus as recited in claim 13, the input device comprising an input device that is physically separate from and communicatively removable from a computing device.

18. An apparatus as recited in claim 13, the analyzing comprising analyzing the force information to automatically classify the intent of the user in the absence of another option or button selection by the user to indicate the intent of the user.

19. An apparatus as recited in claim 13, the classifying the intent of the particular single touch user input as a key strike comprising classifying the intent of the particular single touch user input as a key strike only if the initial impact time duration is within a particular time range.

20. An apparatus as recited in claim 13, the analyzing including defining an additional time duration beginning when pressure applied as the particular single touch user input rises to the start threshold amount, and ending when the pressure applied as the particular single touch user input drops to an additional stop threshold amount, and identifying a maximum force applied as the particular single touch user input during the additional time duration, and the classifying the intent of the particular single touch user input as a mouse click comprising classifying the intent of the particular single touch user input as a mouse click only if the maximum force applied as the particular single touch user input during the additional time duration is applied at least a threshold amount of time after the beginning of the additional time duration.

* * * * *